United States Patent
Rivera

(10) Patent No.: US 12,072,543 B1
(45) Date of Patent: Aug. 27, 2024

(54) SIMULTANEOUS EDGE BLACKENING AND LIGHT RECYCLING IN OPTICAL WAVEGUIDE DISPLAYS

(71) Applicant: Meta Platforms Technologies, LLC, Menlo Park, CA (US)

(72) Inventor: Pasqual Rivera, Woodinville, WA (US)

(73) Assignee: META PLATFORMS TECHNOLOGIES, LLC, Menlo Park, CA (US)

(*) Notice: Subject to any disclaimer, the term of this patent is extended or adjusted under 35 U.S.C. 154(b) by 78 days.

(21) Appl. No.: 18/060,145

(22) Filed: Nov. 30, 2022

Related U.S. Application Data

(60) Provisional application No. 63/284,152, filed on Nov. 30, 2021.

(51) Int. Cl.
*G02B 6/42* (2006.01)
*F21V 8/00* (2006.01)
*G02B 27/01* (2006.01)
*H01L 31/054* (2014.01)
*H01L 31/18* (2006.01)

(52) U.S. Cl.
CPC ......... *G02B 6/4295* (2013.01); *G02B 6/0083* (2013.01); *G02B 27/0172* (2013.01); *H01L 31/054* (2014.12); *H01L 31/18* (2013.01)

(58) Field of Classification Search
CPC ............... G02B 6/4295; G02B 6/0083; G02B 27/0172; H01L 31/054; H01L 31/18
See application file for complete search history.

(56) References Cited

U.S. PATENT DOCUMENTS

| | | | |
|---|---|---|---|
| 9,535,253 B2 | 1/2017 | Levola et al. | |
| 10,983,340 B2 * | 4/2021 | Popovich | G02B 6/0026 |
| 11,187,900 B2 * | 11/2021 | Cheng | G03B 21/00 |
| 11,509,260 B1 | 11/2022 | Mohanty et al. | |
| 2005/0150542 A1 | 7/2005 | Madan | |
| 2009/0221111 A1 | 9/2009 | Frolov et al. | |
| 2010/0288352 A1 | 11/2010 | Ji et al. | |
| 2011/0011445 A1 | 1/2011 | Spencer et al. | |
| 2014/0230897 A1 | 8/2014 | Waldman et al. | |
| 2018/0120483 A1 | 5/2018 | Shimura et al. | |

(Continued)

FOREIGN PATENT DOCUMENTS

WO     WO-2016182009 A1     11/2016

OTHER PUBLICATIONS

Final Office Action mailed Dec. 14, 2020 for U.S. Appl. No. 16/171,115, filed Oct. 25, 2018, 14 pages.

(Continued)

*Primary Examiner* — Seung C Sohn
(74) *Attorney, Agent, or Firm* — Weaver Austin Villeneuve & Sampson LLP

(57) ABSTRACT

A waveguide display includes a waveguide configured to transport display light visible to human eyes, a coupler formed on a broadside surface of the waveguide and configured to couple portions of the display light out of the waveguide at one or more regions of the waveguide, and a photovoltaic device at an edge of the waveguide, the photovoltaic device configured to convert at least a portion of the display light that reaches the edge of the waveguide into electrical power.

20 Claims, 20 Drawing Sheets

(56) References Cited

U.S. PATENT DOCUMENTS

2018/0188542 A1  7/2018  Waldern et al.

OTHER PUBLICATIONS

Final Office Action mailed Oct. 29, 2021 for U.S. Appl. No. 16/171,115, filed Oct. 25, 2018, 15 pages.
Non-Final Office Action mailed Mar. 12, 2021 for U.S. Appl. No. 16/171,115, filed Oct. 25, 2018, 13 pages.
Non-Final Office Action mailed May 15, 2020 for U.S. Appl. No. 16/171,115, filed Oct. 25, 2018, 16 pages.
Notice of Allowance mailed Jul. 21, 2022 for U.S. Appl. No. 16/171,115, filed Oct. 25, 2018, 7 pages.

* cited by examiner

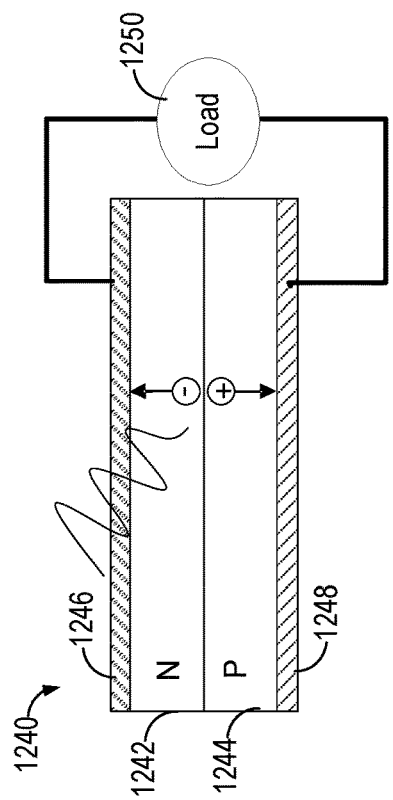
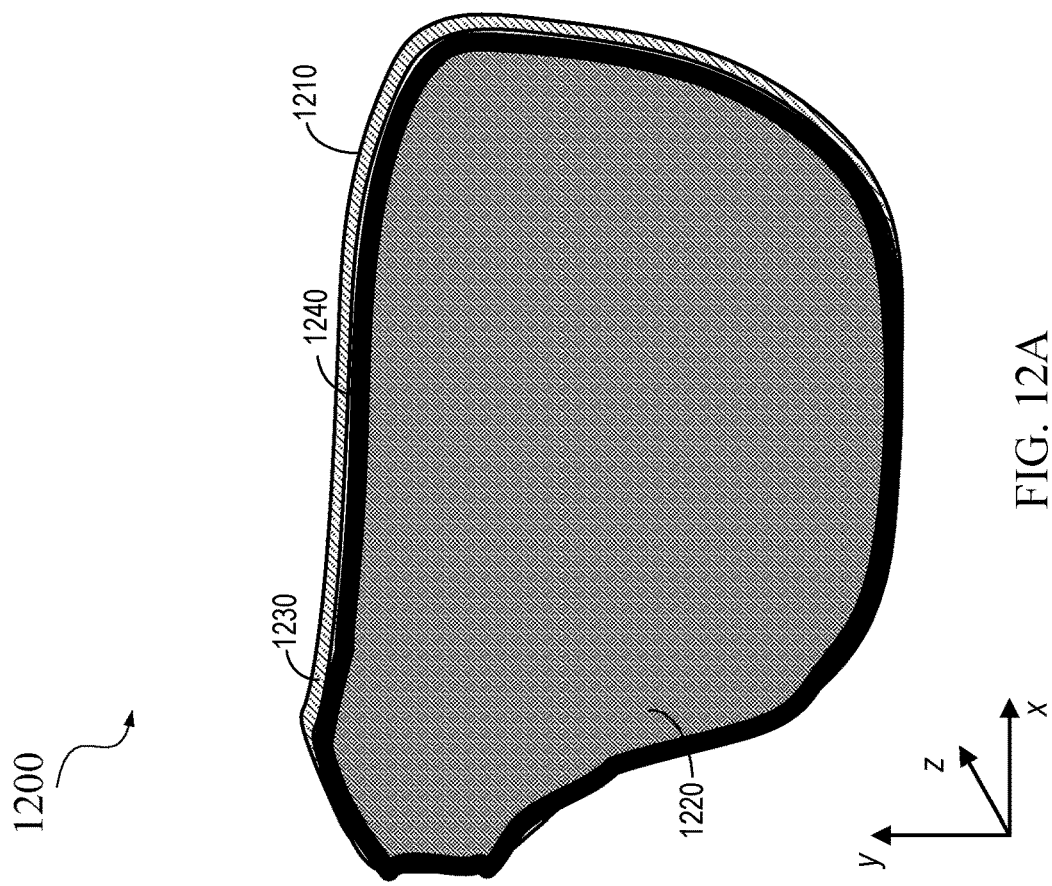
FIG. 12B
FIG. 12A

SIMULTANEOUS EDGE BLACKENING AND LIGHT RECYCLING IN OPTICAL WAVEGUIDE DISPLAYS

CROSS-REFERENCE TO RELATED APPLICATION

This application claims the benefit of and priority to U.S. Provisional Application No. 63/284,152, filed Nov. 30, 2021, entitled "SIMULTANEOUS EDGE BLACKENING AND LIGHT RECYCLING IN OPTICAL WAVEGUIDE DISPLAYS," which is herein incorporated by reference in its entirety for all purposes.

BACKGROUND

An artificial reality system, such as a head-mounted display (HMD) or heads-up display (HUD) system, generally includes a near-eye display (e.g., in the form of a headset or a pair of glasses) configured to present content to a user via an electronic or optic display within, for example, about 10-20 mm in front of the user's eyes. The near-eye display may display virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through).

One example of an optical see-through AR system may use a waveguide-based optical display, where light of projected images may be coupled into a waveguide (e.g., a transparent substrate), propagate within the waveguide, and be coupled out of the waveguide at different locations. In some implementations, the light of the projected images may be coupled into or out of the waveguide using diffractive optical elements, such as volume holographic gratings and/or surface-relief gratings. Light from the surrounding environment may pass through a see-through region of the waveguide and reach the user's eyes as well.

SUMMARY

This disclosure relates generally to waveguide-based near-eye display systems. More specifically, disclosed herein are techniques for reducing light reflection at the edges of waveguides by absorbing and converting light incident on edges of the waveguide into electric power, thereby improving the quality of the displayed image and the efficiency of the waveguide-based near-eye display systems. Various inventive embodiments are described herein, including devices, systems, materials, structures, methods, processes, and the like.

According to certain embodiments, a waveguide display may include a waveguide configured to transport display light visible to human eyes, a coupler formed on a broadside surface of the waveguide and configured to couple portions of the display light out of the waveguide at one or more regions of the waveguide, and a photovoltaic device at an edge of the waveguide, the photovoltaic device configured to convert at least a portion of the display light that reaches the edge of the waveguide into electrical power.

In some embodiments of the waveguide display, the photovoltaic device may include a p-type layer and an n-type layer, and at least one of the p-type layer, the n-type layer, or both may be formed in the waveguide. In some embodiments, the photovoltaic device includes a p-type layer and an n-type layer, and at least one of the p-type layer, the n-type layer, or both may be deposited on the broadside surface or sidewalls of the waveguide. In some embodiments, the p-type layer and the n-type layer may be implanted in the waveguide and may be at different depths from the broadside surface of the waveguide. In some embodiments, the p-type layer and the n-type layer may be implanted in the waveguide and may be at different depths from a sidewall surface of the waveguide. In some embodiments, the waveguide may be p-doped and a surface layer of the waveguide may be n-doped. In some embodiments, the waveguide may be n-doped and a surface layer of the waveguide may be p-doped. In some embodiments, dopants in the n-type layer may include N, P, As, Ti, Cr, V, or a combination thereof, and dopants in the p-type layer may include B, Al, Ga, Ge, V, or a combination thereof. In some embodiments, the photovoltaic device may include a p-type region and an n-type region, and the p-type region and the n-type region may be formed in the waveguide and may be at different regions of the broadside surface of the waveguide.

In some embodiments of the waveguide display, the photovoltaic device may include a p-type layer and an n-type layer, and at least one of the p-type layer, the n-type layer, or both may be deposited on the broadside surface or sidewalls of the waveguide. In some embodiments, the photovoltaic device may include a thin-film photovoltaic cell, the thin-film photovoltaic cell including a plurality of thin-film layers deposited on the broadside surface or sidewalls of the waveguide. The plurality of thin-film layers may include, for example, an amorphous silicon carbide layer, a crystalline silicon layer, a cadmium telluride (CdTe) layer, a copper indium gallium selenide (CIGS) layer, a copper indium selenide (CIS) layer, a perovskite material layer, a dye-sensitized organic material layer, a quantum dots material layer, or a combination thereof.

In some embodiments of the waveguide display, the waveguide may be characterized by a refractive index greater than 2.0, and may include a substrate of, for example, SiC, $LiNbO_3$, rutile, zinc sulfide, or zinc selenide. In some embodiments, the waveguide display may also include two electrodes, the two electrodes including a metal electrode, a transparent conductive oxide electrode, or both. In some embodiments, the photovoltaic device may include a tandem photovoltaic cell, a multijunction photovoltaic cell, or a stacked photovoltaic cell including photovoltaic cells having peak absorption at different wavelengths. In some embodiments, the waveguide display may also include a gate dielectric layer. In some embodiments, the waveguide display may also include a rechargeable battery or an electrical circuit connected to the photovoltaic device.

According to certain embodiments, a near-eye display system may include a frame, one or more projectors configured to generate display light for displaying an image to a user's eye, a waveguide coupled to the frame and configured to transport the display light, one or more couplers configured to coupler the display light from the one or more projectors into the waveguide, an output coupler formed on a broadside surface of the waveguide and configured to couple portions of the display light out of the waveguide at one or more regions of the waveguide, and a photovoltaic device at an edge of the waveguide and electrically coupled to the frame, the photovoltaic device configured to convert at least a portion of the display light that reaches the edge of the waveguide into electrical power.

In some embodiments of the near-eye display system, the photovoltaic device may include a p-type layer and an n-type layer. In some embodiments, at least one of the p-type layer, the n-type layer, or both may be formed in the waveguide. In some embodiments, the p-type layer and the n-type layer may be in the waveguide and may be at different depths from a surface of the waveguide. In some embodiments, the waveguide may be p-doped and a surface layer of the waveguide may be n-doped. In some embodiments, the waveguide may be n-doped and a surface layer of the waveguide may be p-doped. In some embodiments, the photovoltaic device may include a p-type region and an n-type region, and the p-type region and the n-type region may be formed in the waveguide and may be at different regions of the broadside surface of the waveguide. In some embodiments, at least one of the p-type layer, the n-type layer, or both may be deposited on the broadside surface or sidewalls of the waveguide.

In some embodiments of the near-eye display system, the waveguide may be characterized by a refractive index greater than 2.0. The photovoltaic device may include, for example, a tandem photovoltaic cell, a multijunction photovoltaic cell, or a stacked photovoltaic cell including photovoltaic cells having peak absorption at different wavelengths. In some embodiments, the near-eye display system may also include a rechargeable battery or an electrical circuit in the frame or attached to the frame, the photovoltaic device electrically coupled to the rechargeable battery or the electrical circuit.

According to certain embodiments, a method may include forming one or more optical couplers (e.g., a prism, a surface-relief grating, or a holographic grating) on a broadside surface of a waveguide, forming a photovoltaic device at an edge of the waveguide, and coupling the waveguide to a frame of a near-eye display, the coupling including electrically coupling the photovoltaic device to an electrical device on the frame.

In some embodiments, forming the photovoltaic device at the edge of the waveguide may include implanting p-type dopants into the waveguide at a first implant depth range from the broadside surface or a sidewall surface of the waveguide, and implanting n-type dopants into the waveguide at a second implant depth range from the broadside surface or the sidewall surface of the waveguide, the second implant depth range different from the first implant depth range. In some embodiments, forming the photovoltaic device at the edge of the waveguide may include implanting p-type dopants into the waveguide at a first region of the broadside surface of the waveguide using a first mask, and implanting n-type dopants into the waveguide at a second region of the broadside surface of the waveguide using a second mask, the first region of the broadside surface partially overlapping with the second region of the broadside surface.

In some embodiments, the waveguide may be p-doped, and forming the photovoltaic device at the edge of the waveguide may include implanting n-type dopants into a surface layer of the waveguide, or depositing an n-type material layer on the waveguide. In some embodiments, the waveguide may be n-doped, and forming the photovoltaic device at the edge of the waveguide may include implanting p-type dopants into a surface layer of the waveguide, or depositing a p-type material layer on the waveguide. In some embodiments, forming the photovoltaic device at the edge of the waveguide may include depositing an n-type material layer on the broadside surface or sidewalls of the waveguide, and depositing a p-type material layer on the broadside surface or the sidewalls of the waveguide. In some embodiments, forming the photovoltaic device at the edge of the waveguide may include depositing a plurality of thin-film layers on the broadside surface or sidewalls of the waveguide at the edge of the waveguide. Forming the photovoltaic device at the edge of the waveguide may also include depositing two electrode layers that include a metal layer, a transparent conductive oxide, or both.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 12A illustrates an example of a waveguide display including photovoltaic structures formed at edges of a waveguide according to certain embodiments.

FIG. 12B illustrates an example of a photovoltaic structure according to certain embodiments.

FIG. 13A shows a side view of the example of the waveguide according to certain embodiments. FIG. 13B shows a front view of the example of the waveguide according to certain embodiments. FIG. 13C shows examples of dopant concentration in the thickness direction of a substrate of the waveguide.

FIG. 14A shows a side view of the example of the waveguide according to certain embodiments. FIG. 14B shows a front view of the example of the waveguide according to certain embodiments.

FIG. 15A shows a cross-sectional view of the example of the waveguide according to certain embodiments. FIG. 15B shows a front view of the example of the waveguide according to certain embodiments.

FIG. 16A shows a side view of the example of the waveguide according to certain embodiments. FIG. 16B shows a front view of the example of the waveguide according to certain embodiments.

FIG. 17A shows a cross-sectional view of the example of the waveguide according to certain embodiments. FIG. 17B shows a front view of the example of the waveguide according to certain embodiments.

FIG. 18A shows a side view of the example of the waveguide according to certain embodiments. FIG. 18B shows a front view of the example of the waveguide according to certain embodiments.

Figure 1:
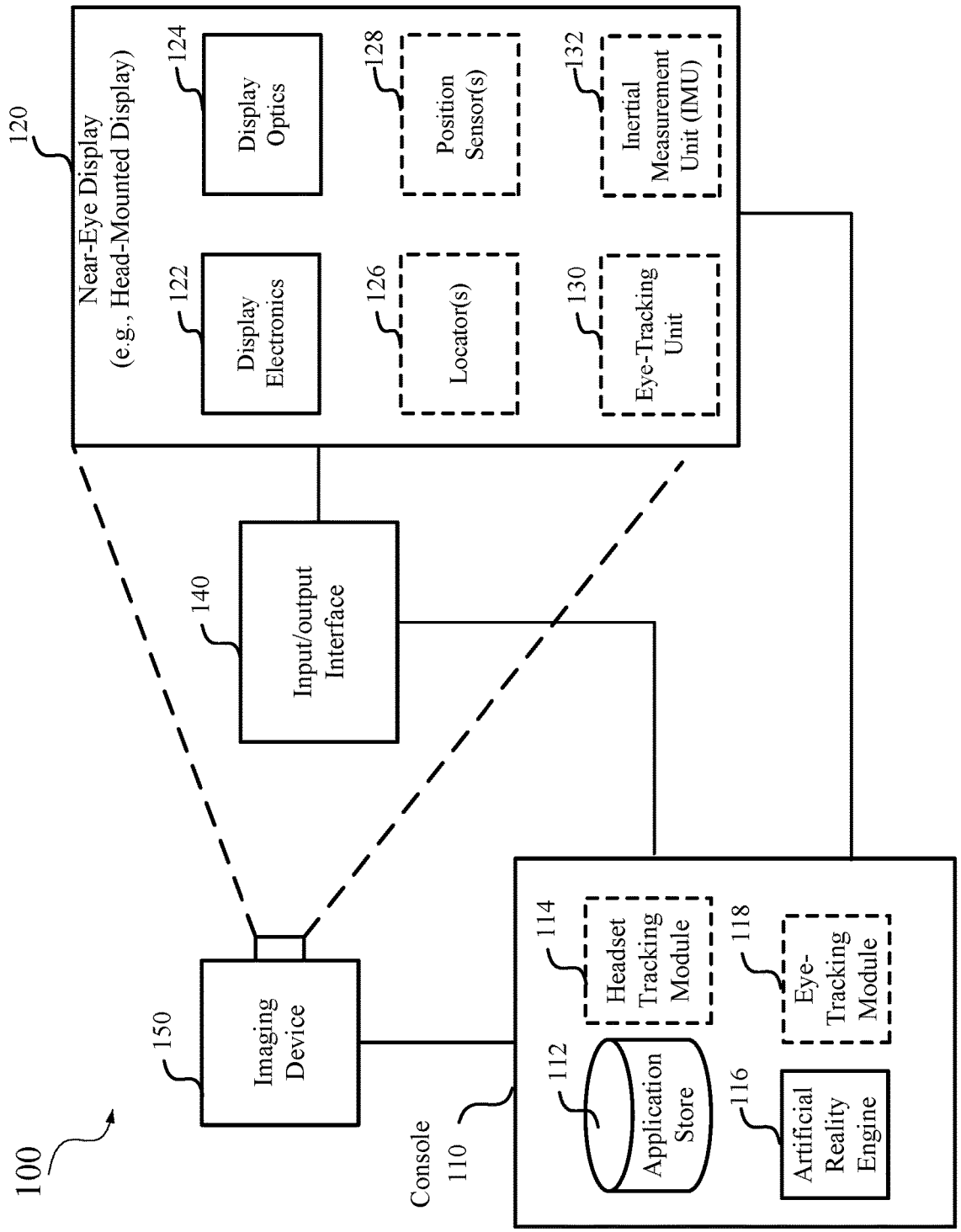
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to waveguide-based near-eye display systems. More specifically, disclosed herein are techniques for reducing light reflection at the edges of waveguides by absorbing and converting light incident on edges of the waveguide into electric power, thereby improving the quality (in particular, the contrast) of the displayed image and the efficiency of the waveguide-based near-eye display systems, while reducing the leakage of display light to external viewers. Various inventive embodiments are described herein, including devices, systems, materials, structures, methods, processes, and the like.

In a near-eye display system, it is generally desirable to expand the eyebox, improve image quality (e.g., resolution and contrast), reduce physical size, increase power efficiency, and increase the field of view (FOV). In a waveguide-based near-eye display system, display light of projected images may be coupled into a waveguide, propagate within the waveguide, and be coupled out of the waveguide at different locations to replicate exit pupils and expand the eyebox. Two or more one-dimensional or two-dimensional gratings may be used to expand the eyebox in two dimensions. In a waveguide-based near-eye display system for augmented reality applications, light from the surrounding environment may also pass through at least a see-through region of the waveguide display (e.g., a transparent substrate) and reach the eyebox and the user's eyes.

In some implementations of the waveguide-based near eye display system, display light of the projected images may be coupled into or out of the waveguide (e.g., a substrate) using refractive optical elements (e.g., prisms) or diffractive optical elements (e.g., gratings), which may also allow light from the surrounding environment to pass through. The display light coupled into the waveguide may propagate within the waveguide through total internal reflection at surfaces of the waveguide, and may be partially diffracted by the gratings when the display light propagating within the waveguide reaches a grating. The undiffracted display light may continue to propagate within the waveguide through total internal reflection and may be partially diffracted when the display light again reaches a grating. At least some portions of the display light coupled into the waveguide may not be diffracted by the gratings and may reach edges of the waveguide. The display light reaching the edges of the waveguide may be reflected back to the waveguide at the interface between the waveguide and another medium (e.g., air, edge coating, or a holder that holds the waveguide) at the edges of the waveguide, which may cause scattered light and reduce image contrast, leading to display performance degradation. The display light reaching the edges of the waveguide may also be partially coupled (e.g., refracted) out of the waveguide and leaked into the environment, and thus may be viewable by external viewers, thereby affecting the appearance of the waveguide display and experience of external users and/or causing security or privacy issues.

In some waveguide displays, the edge reflection may be reduced or eliminated by coating a strongly absorbing material layer along the edges of the waveguide to absorb display light that reaches the edges of waveguide and convert the display light into thermal energy. This edge blackening technique may reduce the light reflection, but may not improve the efficiency of the display system and may cause other issues, such as heating the display system by the thermal energy. In addition, for waveguides with high refractive indices (e.g., SiC, LiNbO$_3$, rutile, zinc sulfide, or zinc selenide), there may be a refractive index mismatch between the waveguide and the strongly absorbing coating material (which generally has a lower refractive index). The refractive index mismatch may cause reflection at the interfaces between the two materials, and thus may lead to reduction in the effectiveness of the strongly absorbing coating material and degradation of the performance of the waveguide displays. Therefore, a different edge blackening technique may be needed for waveguide-based displays, in particular, waveguide displays with substrate materials having very high refractive indices.

According to certain embodiments, the edges of a waveguide (e.g., a transparent substrate) may include photovoltaic devices fabricated in or on the waveguide. The photovoltaic devices may be made by doping the waveguide and/or depositing high-index materials (e.g., semiconductor materials), and thus may have a refractive index similar to the refractive index of the waveguide. Therefore, the photovoltaic devices may not only reduce reflection and absorb light thereby reducing leakage and scattered light and improving contrast, but also convert the light into electric power that may be used by other devices of the waveguide display, thereby improving the performance and the overall power efficiency of the waveguide display.

In some embodiments, the photovoltaic devices may be made by implanting, at edges of the waveguide substrate, p-type dopants (e.g., B, Al, or Ga), n-type dopants (e.g., N, P, or As), or amphoteric dopants (e.g., Vanadium) into the waveguide to form a heterojunction. The heterojunction may be a type-I heterojunction having a straddling bandgap and formed by materials having different bandgaps (e.g., due to different doping in a same base material), or may be a type-II heterojunction having a staggered bandgap where the conduction band and valence band of a first semiconductor material are lower than the conduction band and valence band, respectively, of a second semiconductor material (or the first semiconductor material with a different doping). The bandgap of the heterojunction may be lower than the energy of incident light, such as visible display light or near-infrared light for eye tracking, and thus may absorb the incident light to generate a photocurrent. In some embodiments, the waveguide may be made of a p-type or n-type doped material, and the substrate may then be doped (e.g., implanted or diffused) with a material to form an oppositely doped layer in the waveguide at the edges of the waveguide. In some embodiments, the waveguide may be made of an n-type or p-type doped material, and a layer of an oppositely doped material may be deposited on the waveguide at the edges of the waveguide. In some embodiments, a layer of a p-type material (organic or inorganic, e.g., semiconductor) and a layer of an n-type material (organic or inorganic, e.g., semiconductor) may be deposited on the surface (e.g., sidewalls or broadside surface) of the waveguide at the edges of waveguide. Transparent and/or non-transparent electrodes may be used to collect carriers and conduct photocurrent generated in the p-n junctions by the absorbed photons. In some embodiments, techniques disclosed herein may be used to decouple various other components of the waveguide display, such as different input couplers and output couplers, for example, by fabricating photovoltaic devices in regions between the couplers.

Techniques described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to determine the eye's orientation more accurately.

Figure 2:
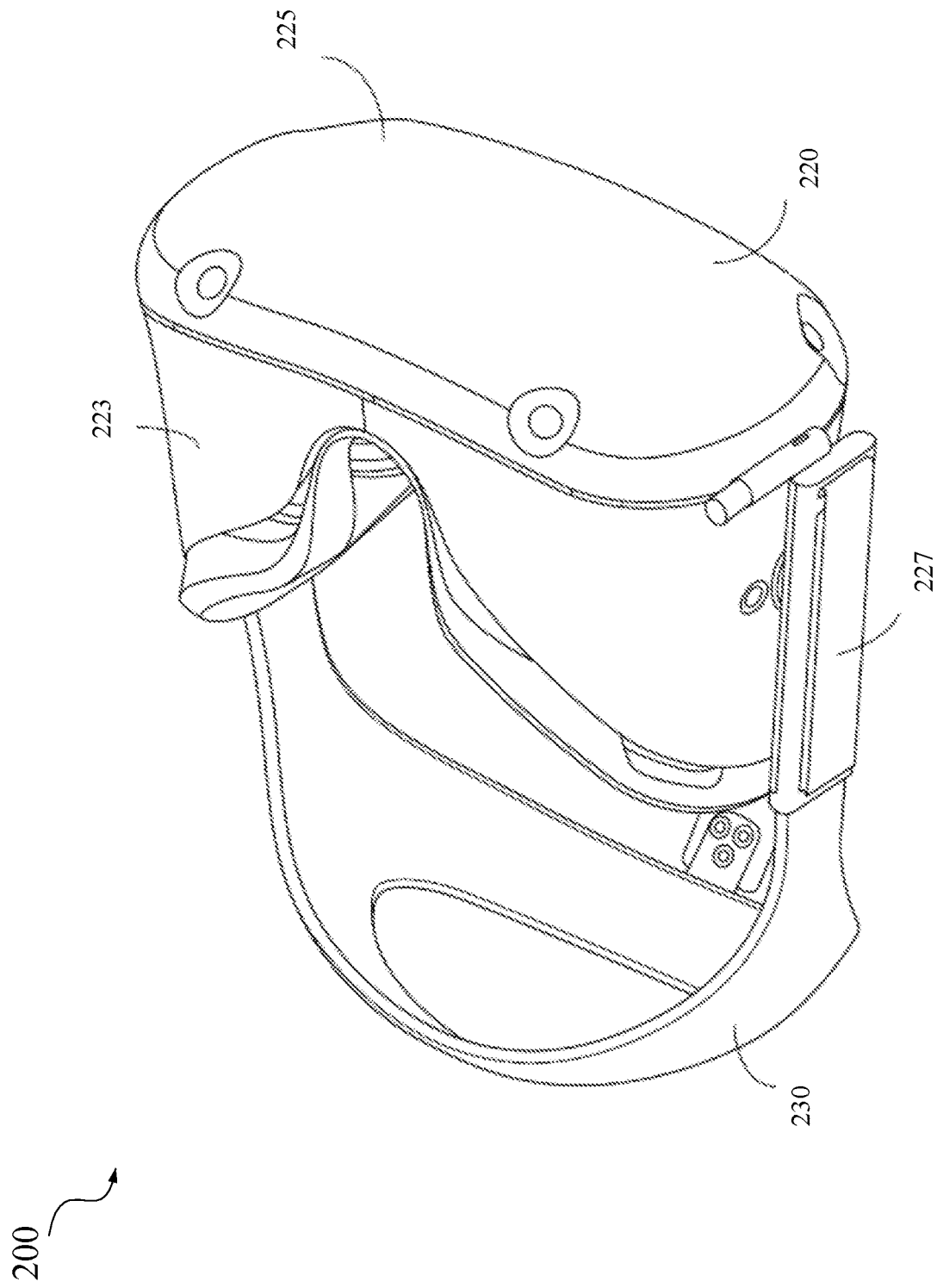
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
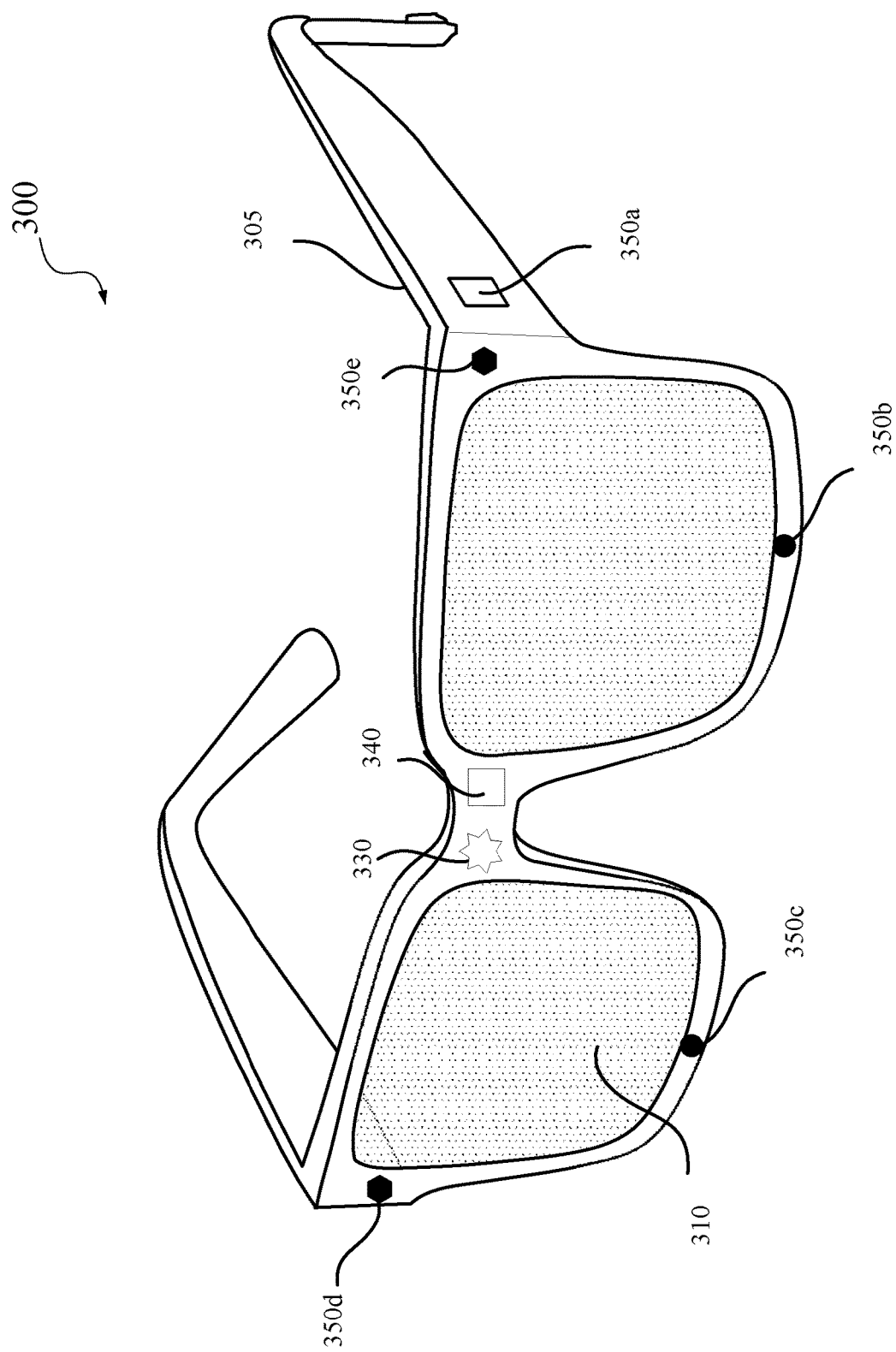
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350*a*, 350*b*, 350*c*, 350*d*, and 350*e* on or within frame 305. In some embodiments, sensors 350*a*-350*e* may include one or more depth sensors, motion sensors, position sensors, inertial sensors, or ambient light sensors. In some embodiments, sensors 350*a*-350*e* may include one or more image sensors configured to generate image data representing different fields of views in different directions. In some embodiments, sensors 350*a*-350*e* may be used as input devices to control or influence the displayed content of near-eye display 300, and/or to provide an interactive VR/AR/MR experience to a user of near-eye display 300. In some embodiments, sensors 350*a*-350*e* may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
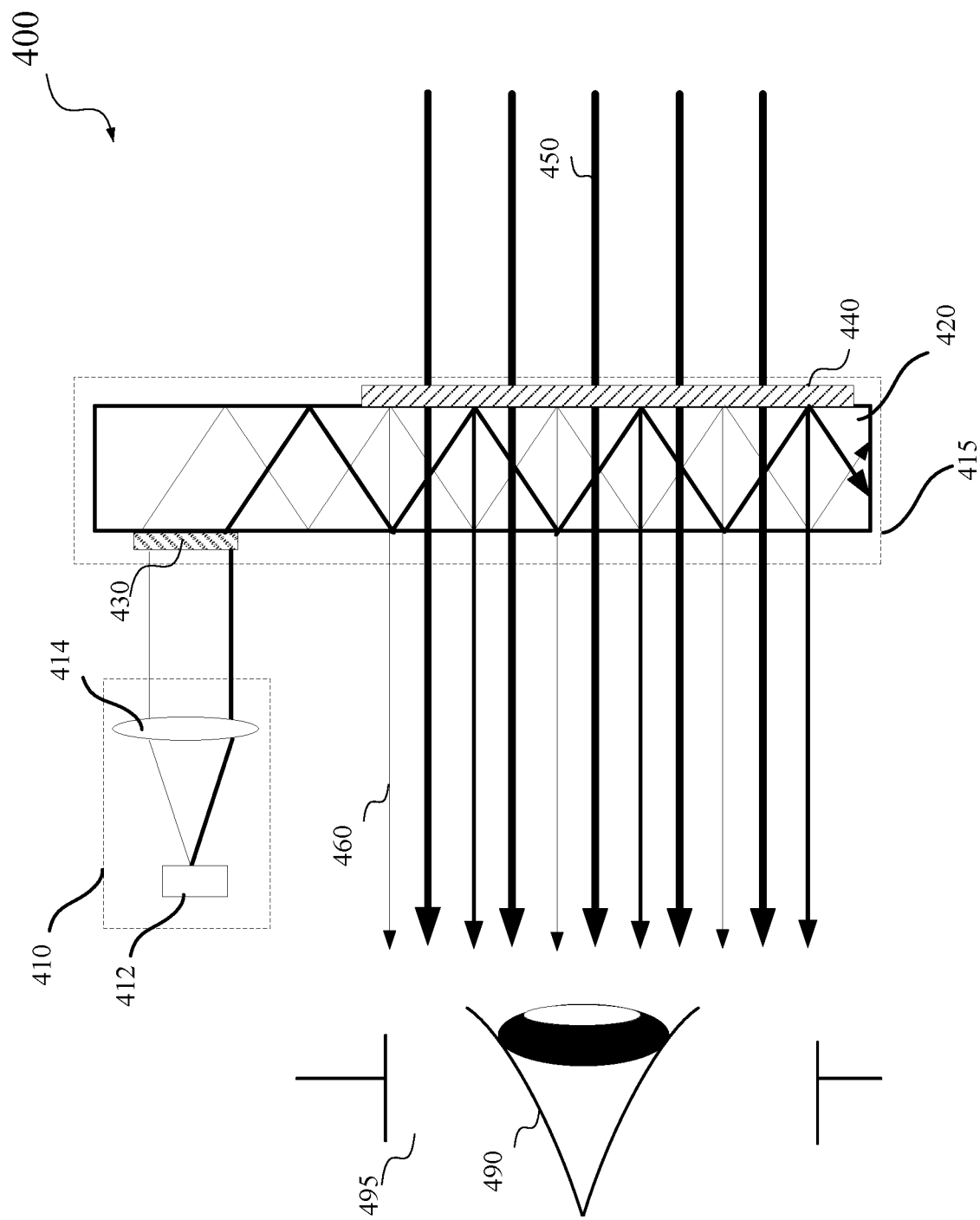
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, SiC, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye of the user of augmented reality system 400 may be located when augmented reality system is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

Figure 5:
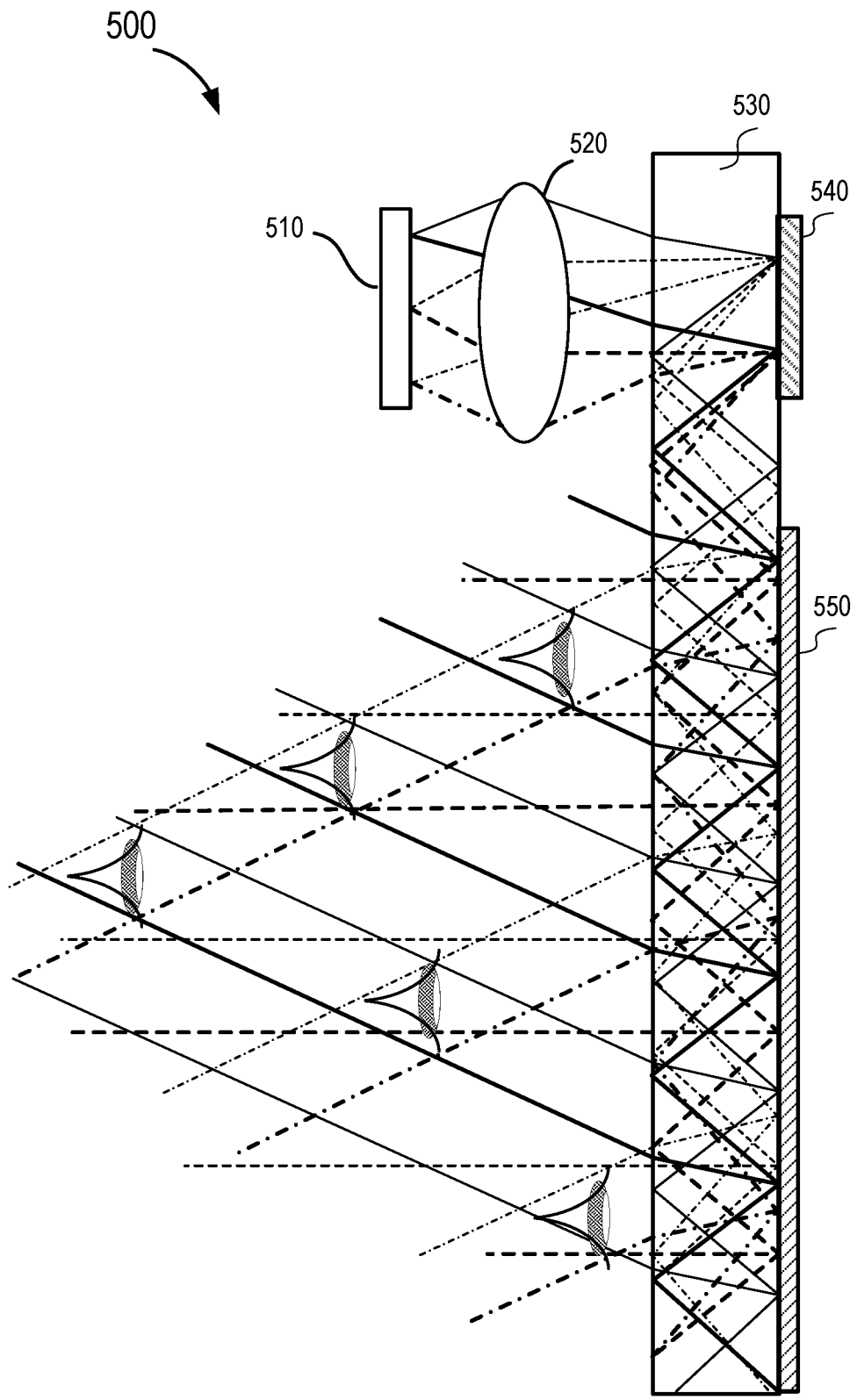
FIG. 5 illustrates an example of an optical see-through augmented reality system including a waveguide display for exit pupil expansion according to certain embodiments.

FIG. 5 illustrates an example of an optical see-through augmented reality system 500 including a waveguide display for exit pupil expansion according to certain embodiments. Augmented reality system 500 may be similar to augmented reality system 500, and may include the waveguide display and a projector that may include a light source or image source 510 and projector optics 520. The waveguide display may include a substrate 530, an input coupler 540, and a plurality of output couplers 550 as described above with respect to augmented reality system 500. While FIG. 5 only shows the propagation of light from a single field of view, FIG. 5 shows the propagation of light from multiple fields of view.

FIG. 5 shows that the exit pupil is replicated by output couplers 550 to form an aggregated exit pupil or eyebox, where different regions in a field of view (e.g., different pixels on image source 510) may be associated with different respective propagation directions towards the eyebox, and light from a same field of view (e.g., a same pixel on image source 510) may have a same propagation direction for the different individual exit pupils. Thus, a single image of image source 510 may be formed by the user's eye located anywhere in the eyebox, where light from different individual exit pupils and propagating in the same direction may be from a same pixel on image source 510 and may be focused onto a same location on the retina of the user's eye. FIG. 5 shows that the image of the image source is visible by the user's eye even if the user's eye moves to different locations in the eyebox.

Figure 6B:
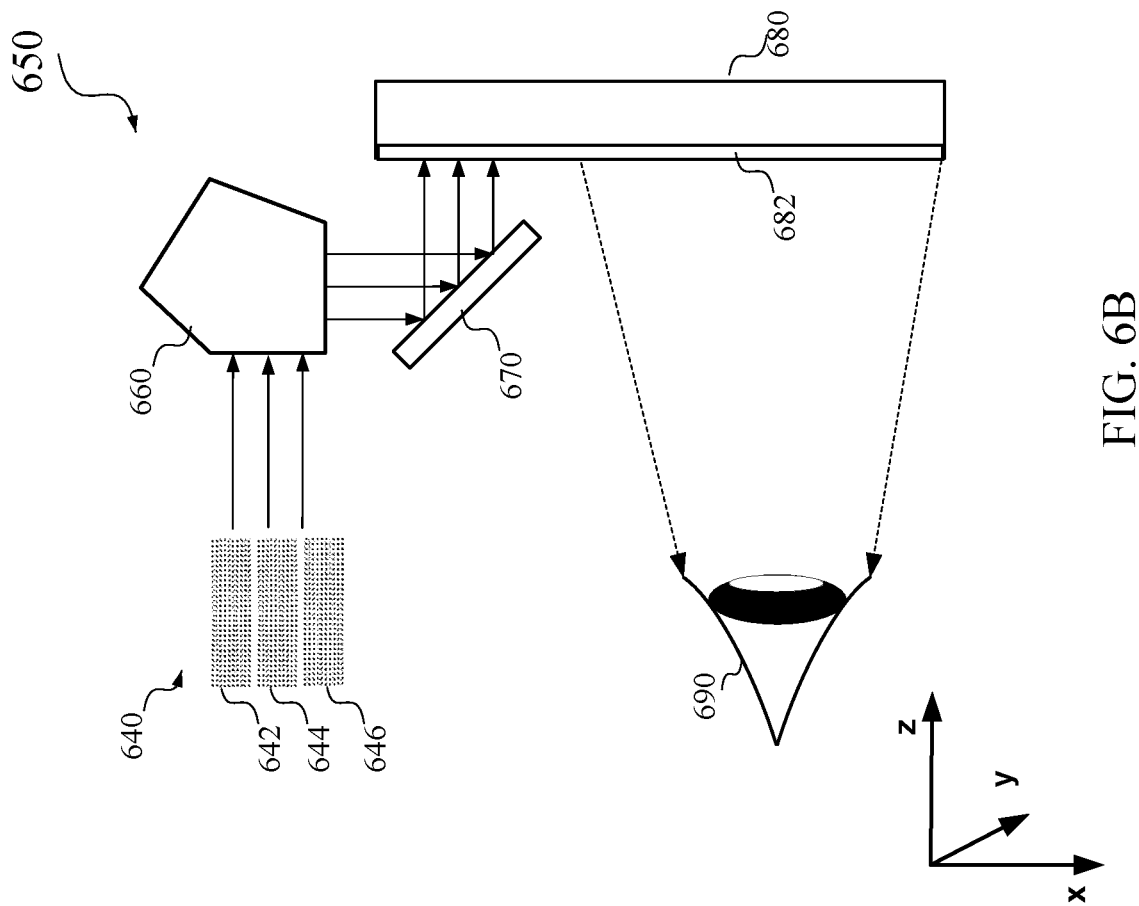
FIG. 6B illustrates an example of a near-eye display device including a waveguide display according to certain embodiments.
Figure 6A:
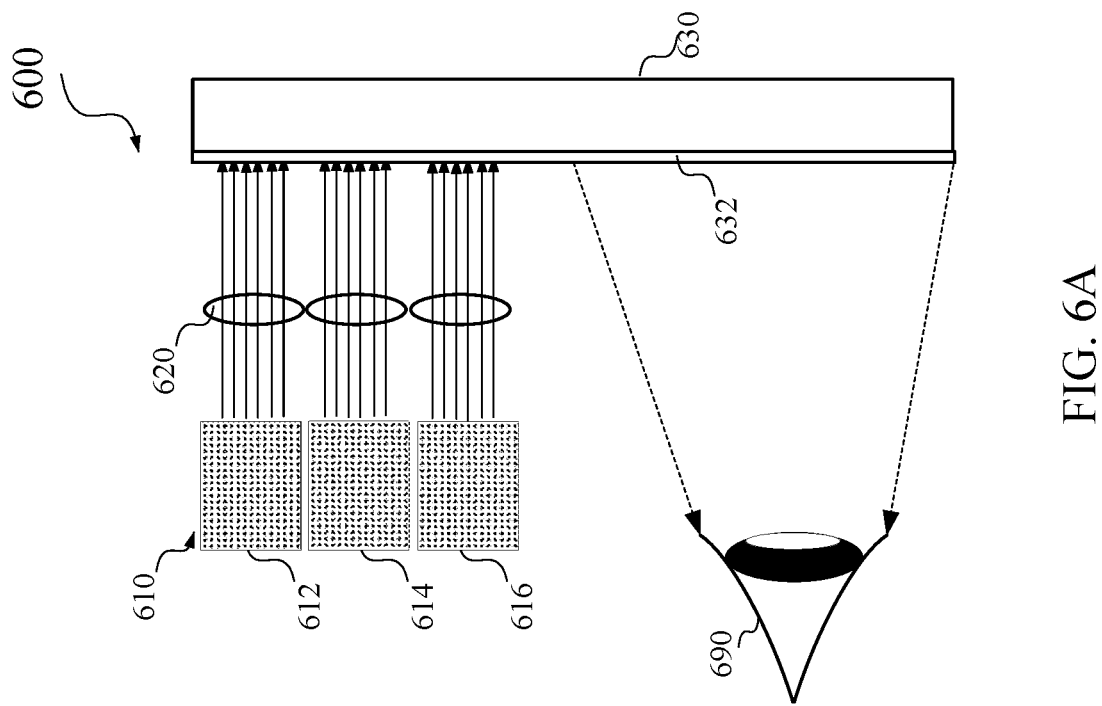
FIG. 6A illustrates an example of a near-eye display device including a waveguide display according to certain embodiments.

FIG. 6A illustrates an example of a near-eye display (NED) device 600 including a waveguide display 630 according to certain embodiments. NED device 600 may be an example of near-eye display 120, augmented reality system 400, or another type of display device. NED device 600 may include a light source 610, projection optics 620, and waveguide display 630. Light source 610 may include multiple panels of light emitters for different colors, such as a panel of red light emitters 612, a panel of green light emitters 614, and a panel of blue light emitters 616. The red light emitters 612 are organized into an array; the green light emitters 614 are organized into an array; and the blue light emitters 616 are organized into an array. The dimensions and pitches of light emitters in light source 610 may be small. For example, each light emitter may have a diameter less than 2 µm (e.g., about 1.2 µm) and the pitch may be less than 2 µm (e.g., about 1.5 µm). As such, the number of light emitters in each red light emitters 612, green light emitters 614, and blue light emitters 616 can be equal to or greater than the number of pixels in a display image, such as 960×720, 1280×720, 1440×1080, 2020×1080, 2160×1080, or 2560×1080 pixels. Thus, a display image may be generated simultaneously by light source 610. A scanning element may not be used in NED device 600.

Before reaching waveguide display 630, the light emitted by light source 610 may be conditioned by projection optics 620, which may include a lens array. Projection optics 620 may collimate or focus the light emitted by light source 610 to waveguide display 630, which may include a coupler 632 for coupling the light emitted by light source 610 into waveguide display 630. The light coupled into waveguide display 630 may propagate within waveguide display 630 through, for example, total internal reflection as described above with respect to FIG. 4. Coupler may also couple portions of the light propagating within waveguide display 630 out of waveguide display 630 and towards user's eye 690.

FIG. 6B illustrates an example of a near-eye display (NED) device 650 including a waveguide display 680 according to certain embodiments. In some embodiments, NED device may use a scanning mirror 670 to project light from a light source 640 to an image field where a user's eye 690 may be located. NED device 650 may be an example of near-eye display 120, augmented reality system 400, or another type of display device. Light source 640 may include one or more rows or one or more columns of light emitters of different colors, such as multiple rows of red light emitters 642, multiple rows of green light emitters 644, and multiple rows of blue light emitters 646. For example, red light emitters 642, green light emitters 644, and blue light emitters 646 may each include N rows, each row including, for example, 2560 light emitters (pixels). The red light emitters 642 are organized into an array; the green light emitters are organized into an array; and the blue light emitters 646 are organized into an array. In some embodiments, light source 640 may include a single line of light emitters for each color. In some embodiments, light source 640 may include multiple columns of light emitters for each of red, green, and blue colors, where each column may include, for example, 1080 light emitters. In some embodiments, the dimensions and/or pitches of the light emitters in light source 640 may be relatively large (e.g., about 3-5 µm) and thus light source 640 may not include sufficient light emitters for simultaneously generating a full display image. For example, the number of light emitters for a single color may be fewer than the number of pixels (e.g., 2560×1080 pixels) in a display image. The light emitted by light source 640 may be a set of collimated or diverging beams of light.

Before reaching scanning mirror 670, the light emitted by light source 640 may be conditioned by various optical devices, such as collimating lenses or a freeform optical element 660. Freeform optical element 660 may include, for example, a multi-facet prism or another light folding element that may direct the light emitted by light source 640 towards scanning mirror 670, such as changing the propagation direction of the light emitted by light source 640 by, for example, about 90° or larger. In some embodiments, freeform optical element 660 may be rotatable to scan the light. Scanning mirror 670 and/or freeform optical element 660 may reflect and project the light emitted by light source 640 to waveguide display 680, which may include a coupler 682 for coupling the light emitted by light source 640 into waveguide display 680. The light coupled into waveguide display 680 may propagate within waveguide display 680 through, for example, total internal reflection as described above with respect to FIG. 4. Coupler 682 may also couple portions of the light propagating within waveguide display 680 out of waveguide display 680 and towards user's eye 690.

Scanning mirror 670 may include a microelectromechanical system (MEMS) mirror or any other suitable mirrors. Scanning mirror 670 may rotate to scan in one or two dimensions. As scanning mirror 670 rotates, the light emitted by light source 640 may be directed to a different area of waveguide display 680 such that a full display image may be projected onto waveguide display 680 and directed to user's eye 690 by waveguide display 680 in each scanning cycle. For example, in embodiments where light source 640 includes light emitters for all pixels in one or more rows or columns, scanning mirror 670 may be rotated in the column or row direction (e.g., x or y direction) to scan an image. In embodiments where light source 640 includes light emitters for some but not all pixels in one or more rows or columns, scanning mirror 670 may be rotated in both the row and column directions (e.g., both x and y directions) to project a display image (e.g., using a raster-type scanning pattern).

NED device 650 may operate in predefined display periods. A display period (e.g., display cycle) may refer to a duration of time in which a full image is scanned or projected. For example, a display period may be a reciprocal of the desired frame rate. In NED device 650 that includes scanning mirror 670, the display period may also be referred to as a scanning period or scanning cycle. The light generation by light source 640 may be synchronized with the rotation of scanning mirror 670. For example, each scanning cycle may include multiple scanning steps, where light source 640 may generate a different light pattern in each respective scanning step.

In each scanning cycle, as scanning mirror 670 rotates, a display image may be projected onto waveguide display 680 and user's eye 690. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 670 may revert back to the initial position to project light for the first few rows of the next display image or may rotate in a reverse direction or scan pattern to project light for the next display image, where a new set of driving signals may be fed to light source 640. The same process may be repeated as scanning mirror 670 rotates in each scanning cycle. As such, different images may be projected to user's eye 690 in different scanning cycles.

Figure 7:
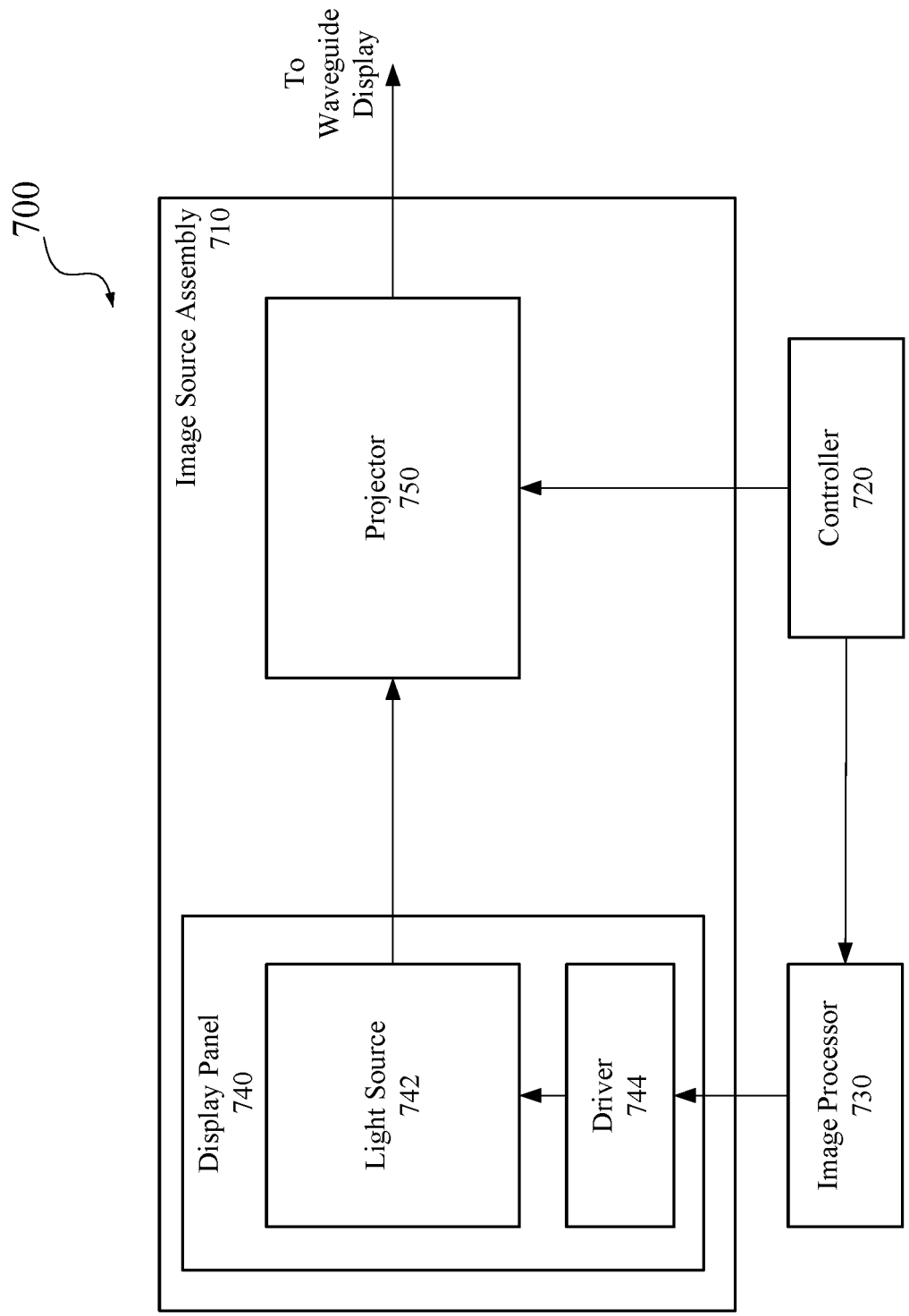
FIG. 7 illustrates an example of an image source assembly in an augmented reality system according to certain embodiments.

FIG. 7 illustrates an example of an image source assembly 710 in a near-eye display system 700 according to certain embodiments. Image source assembly 710 may include, for example, a display panel 740 that may generate display images to be projected to the user's eyes, and a projector 750 that may project the display images generated by display panel 740 to a waveguide display as described above with respect to FIGS. 4-6B. Display panel 740 may include a light source 742 and a driver circuit 744 for light source 742. Light source 742 may include, for example, light source 610 or 640. Projector 750 may include, for example, freeform optical element 660, scanning mirror 670, and/or projection optics 620 described above. Near-eye display system 700 may also include a controller 720 that synchronously controls light source 742 and projector 750 (e.g., scanning mirror 670). Image source assembly 710 may generate and output an image light to a waveguide display (not shown in FIG. 7), such as waveguide display 630 or 680. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 742 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 700. In some embodiments, a display panel in accordance with an embodiment may use more than three primary colors. Each pixel in light source 742 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 720 may control the image rendering operations of image source assembly 710, such as the operations of light source 742 and/or projector 750. For example, controller 720 may determine instructions for image source assembly 710 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 710 to generate image light. The scanning instructions may specify, for example, a type of a source of image light (e.g., monochromatic or polychromatic), a scanning rate, an orientation of a scanning apparatus, one or more illumination parameters, or any combination thereof. Controller 720 may include a combination of hardware, software, and/or firmware not shown here so as not to obscure other aspects of the present disclosure.

In some embodiments, controller 720 may be a graphics processing unit (GPU) of a display device. In other embodiments, controller 720 may be other kinds of processors. The operations performed by controller 720 may include taking content for display and dividing the content into discrete sections. Controller 720 may provide to light source 742 scanning instructions that include an address corresponding to an individual source element of light source and/or an electrical bias applied to the individual source element. Controller 720 may instruct light source 742 to sequentially present the discrete sections using light emitters corresponding to one or more rows of pixels in an image ultimately displayed to the user. Controller 720 may also instruct projector 750 to perform different adjustments of the light. For example, controller 720 may control projector 750 to scan the discrete sections to different areas of a coupling element of the waveguide display (e.g., waveguide display 680) as described above with respect to FIG. 6B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 730 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 730 may be one or more circuits that are dedicated to performing certain features. While image processor 730 in FIG. 7 is shown as a stand-alone unit that is separate from controller 720 and driver circuit 744, image processor 730 may be a sub-unit of controller 720 or driver circuit 744 in other embodiments. In other words, in those embodiments, controller 720 or driver circuit 744 may perform various image processing functions of image processor 730. Image processor 730 may also be referred to as an image processing circuit.

In the example shown in FIG. 7, light source 742 may be driven by driver circuit 744, based on data or instructions (e.g., display and scanning instructions) sent from controller 720 or image processor 730. In one embodiment, driver circuit 744 may include a circuit panel that connects to and mechanically holds various light emitters of light source 742. Light source 742 may emit light in accordance with one or more illumination parameters that are set by the controller 720 and potentially adjusted by image processor 730 and driver circuit 744. An illumination parameter may be used by light source 742 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 742 may include multiple beams of red light, green light, and blue light, or any combination thereof.

Projector 750 may perform a set of optical functions, such as focusing, combining, conditioning, or scanning the image light generated by light source 742. In some embodiments, projector 750 may include a combining assembly, a light conditioning assembly, or a scanning mirror assembly. Projector 750 may include one or more optical components that optically adjust and potentially re-direct the light from light source 742. One example of the adjustment of light may include conditioning the light, such as expanding, collimating, correcting for one or more optical errors (e.g., field curvature, chromatic aberration, etc.), some other adjustments of the light, or any combination thereof. The optical components of projector 750 may include, for example, lenses, mirrors, apertures, gratings, or any combination thereof.

Projector 750 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 750 includes a single scanning mirror that scans in at least two dimensions. In other embodiments, projector 750 may include a plurality of scanning mirrors that each scan in directions orthogonal to each other. Projector 750 may perform a raster scan (horizontally or vertically), a bi-resonant scan, or any combination thereof. In some embodiments, projector 750 may perform a controlled vibration along the horizontal and/or vertical directions with a specific frequency of oscillation to scan along two dimensions and generate a two-dimensional projected image of the media presented to user's eyes. In other embodiments, projector 750 may include a lens or prism that may serve similar or the same function as one or more scanning mirrors. In some embodiments, image source assembly 710 may not include a projector, where the light emitted by light source 742 may be directly incident on the waveguide display.

Figure 8:
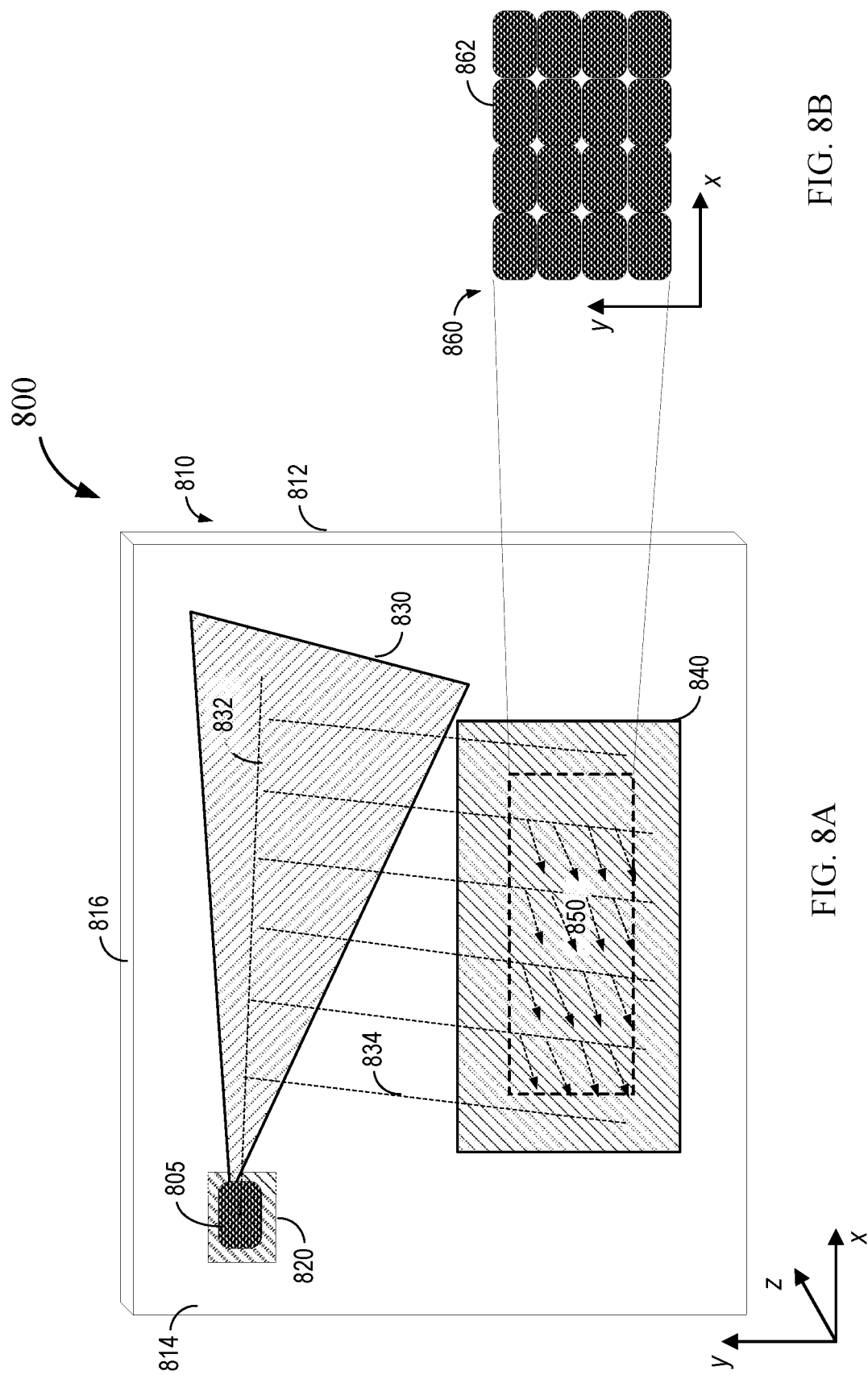
FIG. 8A illustrates an example of an optical see-through augmented reality system including a waveguide display and gratings for exit pupil expansion according to certain embodiments.
FIG. 8B illustrates an example of an eyebox including two-dimensional replicated exit pupils according to certain embodiments.

FIG. 8A illustrates an example of an optical see-through augmented reality system including a waveguide display 800 and surface-relief gratings for exit pupil expansion according to certain embodiments. Waveguide display 800 may include a substrate 810 (e.g., a waveguide), which may be similar to substrate 420 or 530, or waveguide display 680. Substrate 810 may be transparent to visible light and may include, for example, a glass, quartz, plastic, polymer, PMMA, ceramic, $Si_3N_4$, SiC, or crystal substrate. Substrate 810 may be a flat substrate or a curved substrate. Substrate 810 may include two opposing broadside surfaces that include a first surface 812 and a second surface 814, and multiple sidewalls surfaces 816 that may be perpendicular to the broadside surfaces. Display light may be coupled into substrate 810 by an input coupler 820, and may be reflected by first surface 812 and second surface 814 through total internal reflection, such that the display light may propagate within substrate 810. Input coupler may include a grating, a refractive coupler (e.g., a wedge or a prism), or a reflective coupler (e.g., a reflective surface having a slant angle with respect to substrate 810). For example, in one embodiment, input coupler 820 may include a prism that may couple display light of different colors into substrate 810 at a same refraction angle. In another example, input coupler 820 may include a grating coupler that may diffract light of different colors into substrate 810 at different directions. Input coupler 820 may have a coupling efficiency of greater than 10%, 20%, 30%, 50%, 75%, 90%, or higher for visible light.

Waveguide display 800 may also include a first output grating 830 and a second output grating 840 positioned on one or two surfaces (e.g., first surface 812 and second surface 814) of substrate 810 for expanding incident display light beam in two dimensions in order to fill an eyebox with the display light. First output grating 830 may be configured to expand at least a portion of the display light beam along one direction, such as approximately in the x direction. Display light coupled into substrate 810 may propagate in a direction shown by a line 832. While the display light propagates within substrate 810 along a direction shown by line 832, a portion of the display light may be diffracted by a region of first output grating 830 towards second output grating 840 as shown by a line 834 each time the display light propagating within substrate 810 reaches first output grating 830. Second output grating 840 may then expand the display light from first output grating 830 in a different direction (e.g., approximately in the y direction) by diffracting a portion of the display light from an exit region 850 to the eyebox each time the display light propagating within substrate 810 reaches second output grating 840.

FIG. 8B illustrates an example of an eye box including two-dimensional replicated exit pupils. FIG. 8B shows that a single input pupil 805 may be replicated by first output grating 830 and second output grating 840 to form an aggregated exit pupil 860 that includes a two-dimensional array of individual exit pupils 862. For example, the exit pupil may be replicated in approximately the x direction by first output grating 830 and in approximately the y direction by second output grating 840. As described above, output light from individual exit pupils 862 and propagating in a same direction may be focused onto a same location in the retina of the user's eye. Thus, a single image may be formed by the user's eye from the output light in the two-dimensional array of individual exit pupils 862.

Figure 9:
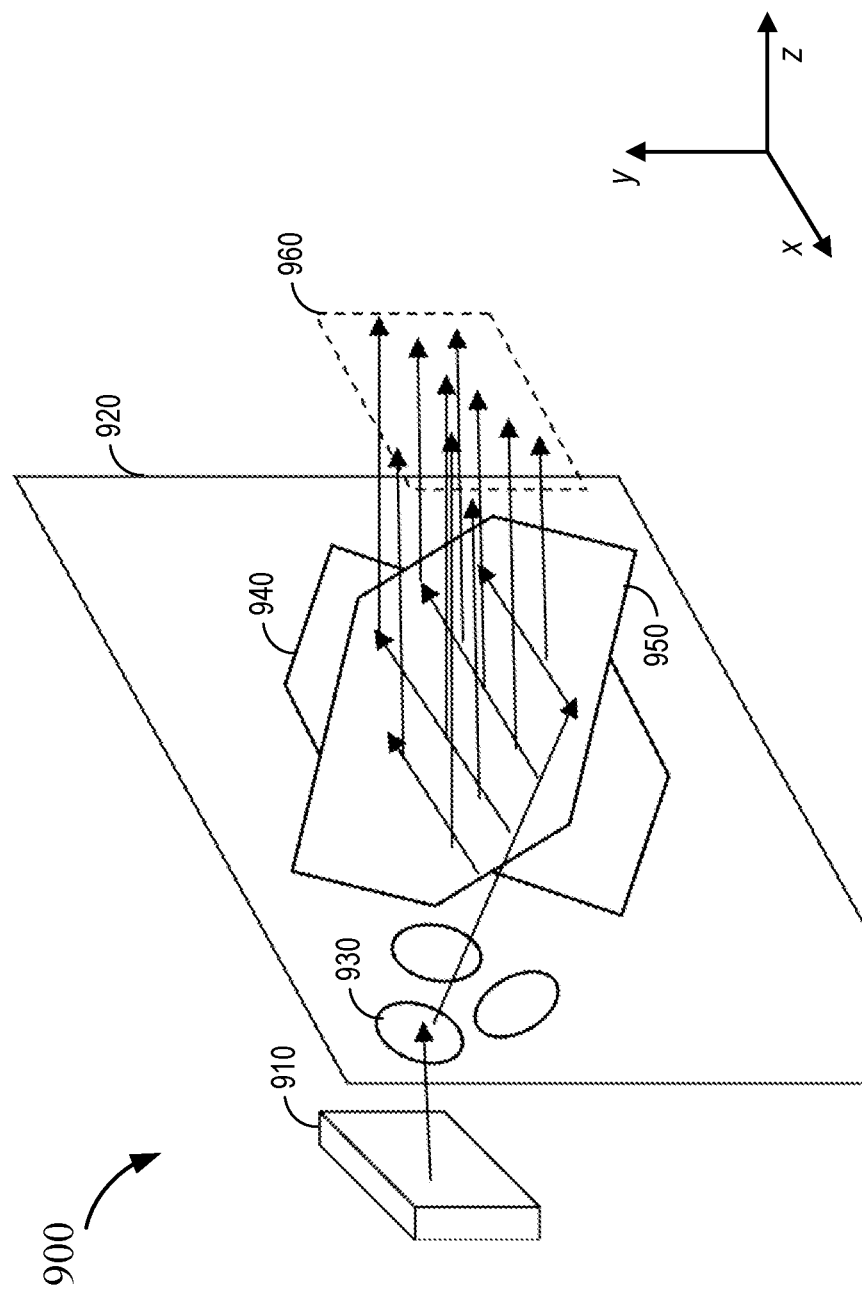
FIG. 9 illustrates an example of a waveguide display with gratings for exit pupil expansion according to certain embodiments.

FIG. 9 is a perspective view of an example of a waveguide display 900 with grating couplers for exit pupil expansion according to certain embodiments. Waveguide display 900 may be an example of waveguide display 800. Waveguide display 900 may include a light source 910, which may include, for example, an array of red micro-LEDs, an array of green micro-LEDs, and an array of blue micro-LEDs. Each array of micro-LEDs may generate an image of a corresponding color, and thus the three arrays of micro-LEDs may generate a color image. Waveguide display 900 may include a substrate 920 with grating couplers formed thereon or coupled thereto. For example, waveguide display 900 may include three input gratings 930, where each input grating 930 may be used to couple display light of a monochromatic image generated by a corresponding array of micro-LEDs into substrate 920. The display light coupled into substrate 920 may propagate within substrate 920 through total internal reflection at the surfaces of substrate 920, and may be diffracted at multiple locations along a first direction by a first output grating 940, which may replicate the input pupil along the first direction. The display light diffracted at different locations of first output grating 940 may reach a second output grating 950, which may diffract the display light at different locations along a second direction to replicate the input pupil along the second direction as described above. The diffracted light may then propagate towards an eyebox 960.

In many waveguide displays, a large portion of the display light emitted by a projector may not be coupled into the waveguide by input couplers or may not be coupled out of the waveguide towards the desired direction (e.g., towards the eyebox). Therefore, the efficiency of the waveguide display may be very low, such as below about 10%, below about 5%, or lower. At least some portions of the display light coupled into the waveguide may not be diffracted by gratings to the desired direction and may reach edges of the waveguide. The display light reaching the edges of the waveguide may be reflected back to the waveguide at the interface between the waveguide and another medium (e.g., air, a coating material, or a holder of the waveguide) at the edges, which may cause scattered light and reduce image contrast, leading to display quality degradation. The display light reaching the edges of the waveguide may also be partially coupled (e.g., refracted) out of the waveguide and leaked into the environment, and thus may be viewable by external viewers, thereby affecting the appearance of the waveguide display and experience of external users and/or causing security or privacy issues.

Figure 10:
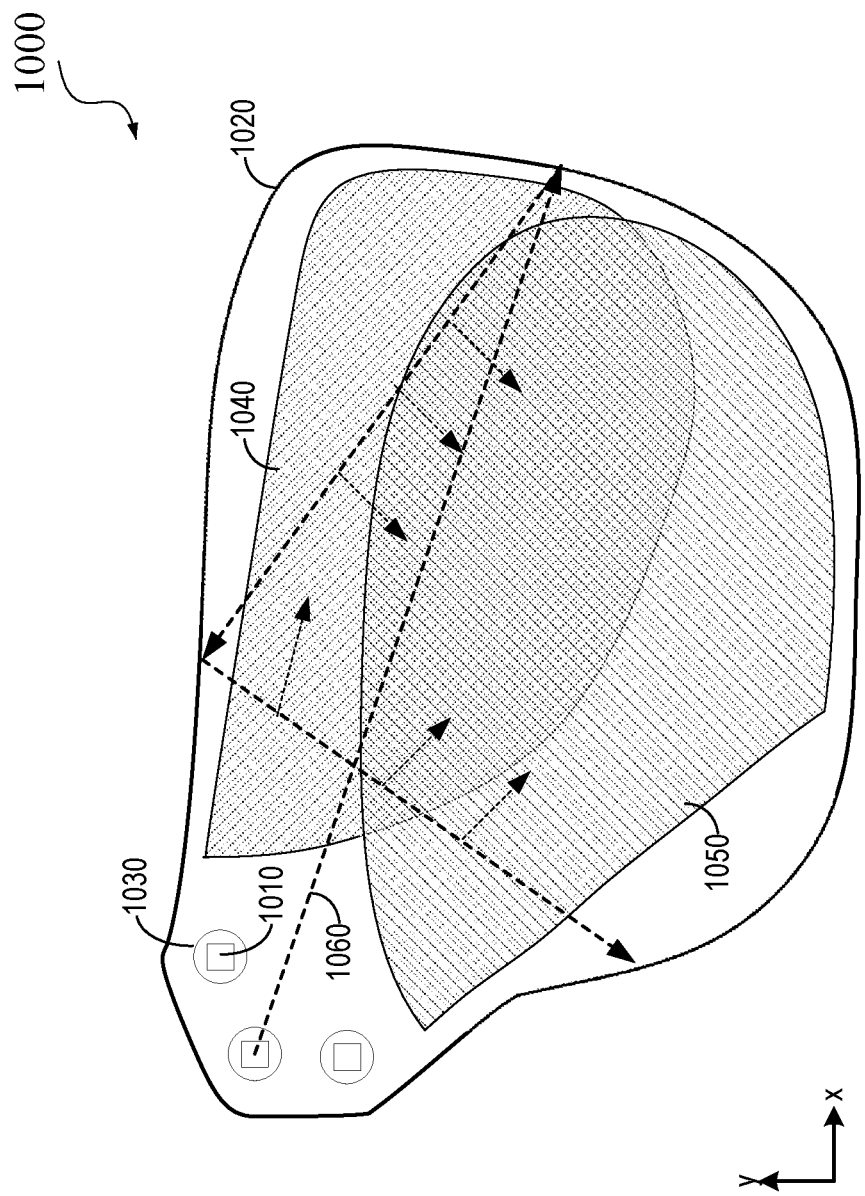
FIG. 10 illustrates an example of a waveguide display in which some display light coupled into the waveguide may be reflected by the edges of the waveguide back to the waveguide.

FIG. 10 illustrates an example of a waveguide display 1000 in which some display light coupled into the waveguide (e.g., a transparent substrate 1020) may be reflected by the edges (e.g., sidewalls) of the waveguide back to the waveguide. In the illustrated example, waveguide display 1000 may include three image sources 1010 (e.g., image projectors described above), substrate 1020, a set of input couplers 1030 (e.g., gratings or prisms), and a set of one-dimensional gratings or one or more two-dimensional gratings (e.g., a first output grating 1040 and a second output grating 1050) for pupil expansion as described above. Input couplers 1030 and the gratings for pupil expansion may be attached to or formed (e.g., etched) in substrate 1020 as described above. In some embodiments, waveguide display 1000 may also include a recycling grating that directs the light back into the output gratings. In some embodiments, waveguide display 1000 may also include small disparity sensor gratings for tracking the relative motion of the two binocular center FOVs. In some embodiments, the recycling grating or the disparity sensor grating may be wavelength sensitive or wavelength selective, and may only absorb and/or convert light in a certain wavelength range, such as only absorbing and/or converting blue light, green light, red light, or infrared light.

Image sources 1010 may generate images of red, green, and blue light, respectively. The images generated by image sources 1010 may be coupled into substrate 1020 by a set of input couplers 1030. Display light 1060 generated by image sources 1010 and coupled into substrate 1020 by input couplers 1030 may propagate within substrate 1020 through total internal reflection at two opposing broadside surfaces of substrate 1020. During the propagation, display light 1060 may be partially diffracted by first output gratings 1040 and second output grating at multiple locations, and may be partially reflected to continue to propagate within substrate 1020, as described above with respect to, for example, FIGS. 4 and 5. At least a portion of display light 1060 may reach the edges of substrate 1020, and may be reflected by sidewalls of substrate 1020 back into the regions of output gratings 1040 and 1050, or even input couplers 1030. Some portions of display light 1060 may be refracted out of substrate 1020 at the sidewalls. The reflected display light may continue to propagate within substrate 1020, and may be diffracted by first output grating 1040, second output grating 1050, and/or input couplers 1030, which may become stray light and/or may form ghost images or direct light back into the projector assembly or light source. A fraction of the reflected display light may again reach the edges of substrate 1020 and be reflected back to substrate 1020 by the edges of substrate 1020, and may be directed towards user's eyes by input couplers 1030, first output grating 1040, second output grating 1050, any recycling grating, or any disparity sensor grating that may be part of the device as shown in FIG. 10. Many such edge reflections may occur before light is out-coupled into an undesired direction by any of input couplers 1030, first output grating 1040, second output grating 1050, any recycling grating, or any disparity sensor grating that may be part of the device. This may also cause the glasses or user's face to glow with unstructured outcoupled light. As such, the contrast, resolution, and brightness of the images displayed to user's eyes may be low.

In some waveguide displays, the edge reflection may be reduced or eliminated by coating a strongly absorbing material layer at and/or near the edges of the waveguide to absorb display light that reaches the edges of waveguide. For example, an organic or inorganic opaque material layer may be formed on the sidewalls, on the broadside surfaces, or under the surfaces of substrate 1020 at or near the edges of substrate 1020. The opaque material layer may absorb the display light and convert the absorbed display light to heat. As such, the portion of the display light that is reflected at the edges of substrate 1020 may be reduced. One or more opaque light-absorbing layers may be coated on the sidewalls or the broadside surfaces of substrate 1020 along edges of substrate 1020 to increase the light absorption of display light that reaches the edges.

Figure 11:
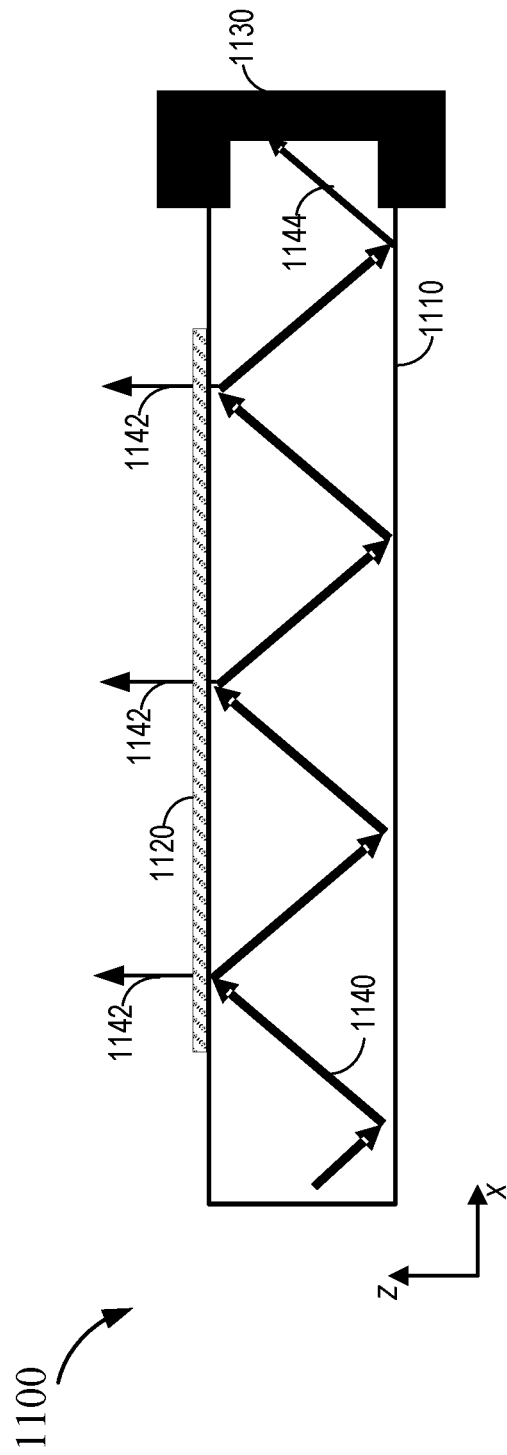
FIG. 11 illustrates an example of a waveguide display including blackening at or near edges of the waveguide display.

FIG. 11 illustrates an example of a waveguide display 1100 including blackening at or near edges of the waveguide display. Waveguide display 1100 may include a substrate 1110 and a grating coupler 1120 formed on substrate 1110. Edges of substrate 1110 may be coated with an opaque light-absorbing layer 1130. In some implementations, opaque light-absorbing layer 1130 may be deposited on broadside surfaces of substrate 1110 at the edges of substrate 1110, and/or may be formed (e.g., by implant or etch and deposition) under the surfaces of substrate 1110 at the edges of substrate 1110. FIG. 11 shows display light 1140 propagating within substrate 1110 through total internal reflection, where portions of display light 1142 may be coupled out of substrate 1110 by grating coupler 1120. At least a portion 1144 of the display light may reach edges of substrate 1110 and may be incident on opaque light-absorbing layer 1130. Opaque light-absorbing layer 1130 may include, for example, a pigmented synthetic resin layer, a metal layer, and/or an antireflection layer, and may absorb the display light such that back-reflection at edges if substrate 1110 may be reduced or suppressed and the display light may not be refracted out of substrate 1110 to become stray light (which may be reflected by other parts of waveguide display 1100, thereby reducing the quality of the displayed images). The opaque light-absorbing layer 1130 may convert the absorbed light into heat.

The edge blackening technique using one or more opaque light-absorbing coating layers described above may reduce the light reflection, but may not improve the efficiency of the display system and may cause other issues, such as heating the waveguide display. In addition, in some waveguide displays, such as waveguide displays using surface-relief gratings, it may be desirable to use substrates that have high refractive indices (e.g., greater than about 2.0 or 2.5), such as SiC (with a refractive index between about 2.3 and about 3.4 depending on the C/Si ratio), $LiNbO_3$, rutile, zinc sulfide, or zinc selenide, in order to increase the refractive index contrast and improve the manufacturability, diffraction efficiency, field of view, and spectral range. For these waveguides with high refractive indices, there may be a refractive index mismatch between the waveguide and the edge blackening coating material, which generally has a lower refractive index, such as less than about 2.0 or less than about 1.6. The refractive index mismatch may cause reflection at the interfaces between the waveguide and the coating layer, and thus may lead to degradation of the performance of the waveguide displays. Therefore, a different edge blackening technique may be needed for waveguide-based displays, in particular, waveguide displays with substrate materials having very high refractive indices, in order to improve both the image quality and efficiency of the waveguide display.

According to certain embodiments, the edges of a waveguide may include photovoltaic devices fabricated in or on the waveguide. The photovoltaic devices may be made by doping the waveguide and/or depositing high-index materials (e.g., semiconductor materials), and thus may have a refractive index similar to the refractive index of the waveguide substrate. Therefore, the photovoltaic devices may not only reduce reflection and absorb light to reduce scattered light and improve contrast, but also convert the light into electric power that may be used by other devices of the waveguide display, thereby improving the performance and the overall efficiency of the waveguide display. In addition, the photovoltaic devices may reduce the leakage of display light into the environment, thereby improving the external appearance, security, and/or privacy of the waveguide display. In some embodiments, the photovoltaic devices may be wavelength sensitive or wavelength selective, and may only absorb and/or convert light in a certain wavelength range, such as only absorbing and/or converting blue light, green light, red light, or infrared light. For example, the dopant profile and/or the deposited materials may be tailored such that the photovoltaic devices may be sensitive to light of specific color(s).

FIG. 12A illustrates an example of a waveguide display 1200 including photovoltaic structures 1240 formed at the edges of a waveguide 1210 according to certain embodiments. Waveguide 1210 may include one or more substrates in a stack, and may include two opposing broadside surfaces 1220 and sidewall surfaces 1230. Grating structures may be coupled to or formed on broadside surfaces 1220. Photovoltaic structures 1240 may be formed at the edges of broadside surfaces 1220 and/or sidewall surfaces 1230 of waveguide 1210. Photovoltaic structures 1240 may absorb photons of, for example, visible light, infrared light, and/or ultraviolet light, and generate free carriers (e.g., electrons and holes) that may form a photocurrent. The photocurrent may be used to drive electrical loading devices, such as a rechargeable battery, circuits described above with respect to FIG. 7 and/or circuits described below with respect to FIG. 20.

FIG. 12B illustrates an example of a photovoltaic structure 1240 according to certain embodiments. Photovoltaic structure 1240 may include a p-type region 1244 and an n-type region 1242. P-type region 1244 may be formed in waveguide 1210 or may be deposited on broadside surface 1220 or sidewall surfaces 1230 of waveguide 1210. Similarly, n-type region may be formed in waveguide 1210 or may be deposited on broadside surface 1220 or sidewall surfaces 1230 of waveguide 1210. Electrode 1246 and electrode 1248 may be electron contact and hole contact used to collect electrons and holes, and may include, for example, a metal, a metal alloy, or a transparent conductive oxide (TCO), such as indium-tin-oxide (ITO) or indium zinc oxide (IZO). P-type region 1244, n-type region 1242, and electrodes 1246 and 1248 may form a homojunction or heterojunction photovoltaic cell. The photocurrent may drive a load device 1250, such as a charging device, a rechargeable battery, circuits described above with respect to FIG. 7, or circuits described below with respect to FIG. 20.

In some embodiments, p-type region 1244, n-type region 1242, or an intrinsic region between p-type region 1244 and n-type region 1242 may have a bandgap lower than the energy of the photons of visible light and thus may generate electron-hole pairs upon absorbing visible light. In some embodiments, light absorbing materials such as crystalline silicon may be deposited on a substrate to absorb photons and generate electron-hole pairs. In some embodiments, a p-n junction may be formed by doping to separate the photogenerated electron-hole pair. As the dopant concentration increases, the electrons and holes may be more effectively separated. However, high dopant concentrations may cause Auger recombination and parasitic free-carrier absorption that may reduce the open circuit voltage and short circuit current, and/or may cause Shockley-Read-Hall (SRH) recombination that may also reduce the open circuit voltage. In some embodiments, materials such as polysilicon, metal insulators, transition metal oxides (e.g., $MoO_x$), amorphous silicon, and the like may be deposited onto a substrate to collect photogenerated carriers without substrate doping.

In one example, the waveguide may be a SiC substrate. The light absorption layer may include a thin intrinsic amorphous silicon carbide (a-SiC:H), a boron-doped a-SiC:H (p) layer, and a phosphorous doped nanocrystalline silicon oxide ($nc-SiO_x$) layer. In some embodiments, the p-type dopants may include, for example, B, Al, Be, V, or Ga, and the n-type dopants may include, for example, N, P, Ti, Cr, V, or As.

In some embodiments, the photovoltaic devices may be made by implanting, at the edge of the waveguide substrate, p-type dopants (e.g., B, Al, Be, V, or Ga) and n-type dopants (e.g., N, P, Ti, Cr, V, or As) into the waveguide substrate to form heterojunctions that may have a bandgap lower than the energy of incident light. As described above, the heterojunction may be a type-I heterojunction having a straddling bandgap and formed by materials having different bandgaps (e.g., due to different doping in a same base material), or may be a type-II heterojunction having a staggered bandgap where the conduction band and valence band of a first semiconductor material are lower than the conduction band and valence band, respectively, of a second semiconductor material (or the first semiconductor material with a different doping). The implantation may be performed with or without the aid of increased temperature for activation, during or after the ion exposure. In some embodiments, vanadium (V) may be used as either the n-type dopant or the p-type dopant, depending on the compensating atoms and polytype of SiC.

Figure 13B:
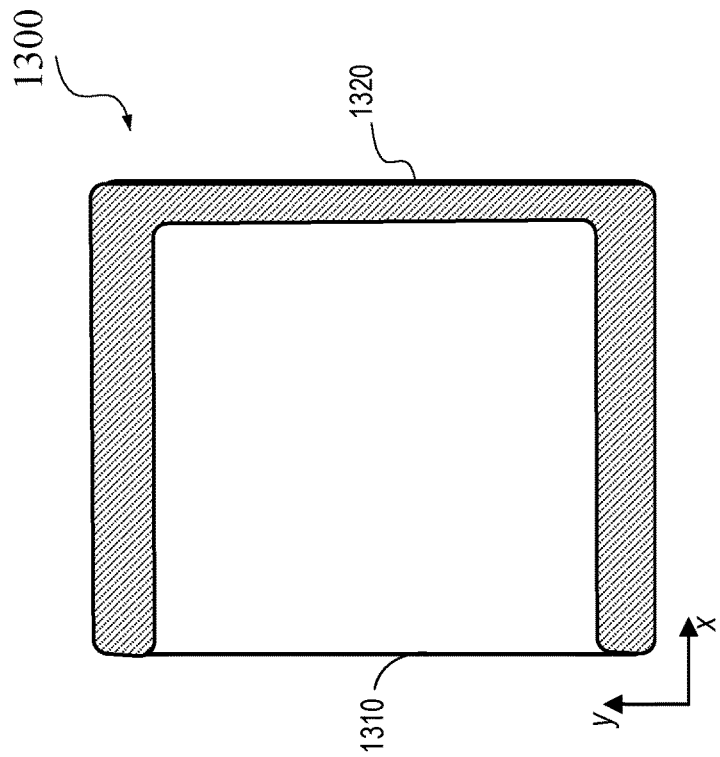
FIGS. 13A-13C illustrate an example of a waveguide including a photovoltaic device at the edges of the waveguide according to certain embodiments.
Figure 13A:
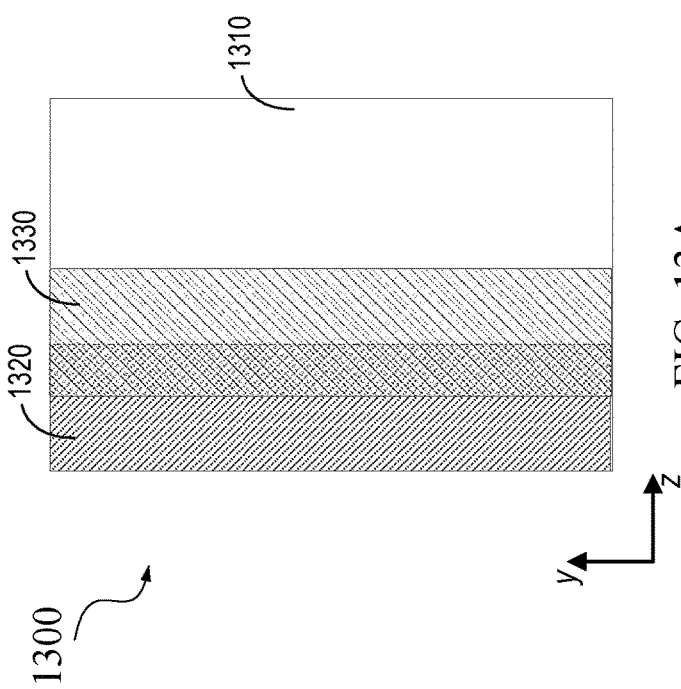

FIGS. 13A-13B illustrate an example of a waveguide 1300 including a photovoltaic device at the edges of waveguide 1300 according to certain embodiments. FIG. 13A shows a side view of the example of waveguide 1300 according to certain embodiments. FIG. 13B shows a front view of the example of waveguide 1300 according to certain embodiments. Waveguide includes a substrate 1310, the peripheral regions of which may be doped by implanting a p-type doping material (e.g., B, Al, Be, V, or Ga) and an n-type doping material (e.g., N, P, Ti, Cr, V, or As) through, for example, ion implantation, where the ion beam may bombard substrate 1310, for example, in the z-direction, or substrate 1310 may be exposed to a proximal plasma in an inductively coupled plasma (ICP) or capacitively coupled plasma (CCP) chamber, with or without bias. The p-type dopants and the n-type dopants may be implanted into substrate 1310 at different speeds and/or energy levels, and thus may penetrate into different depths in substrate 1310. For example, at shown in FIG. 13A, due to the different energy levels of the p-type implantation and the n-type implantation, a first layer 1320 may be mostly p-doped (or n-doped) and a second layer 1330 may be mostly n-doped (or p-doped). First layer 1320 and second layer may form a p-n junction of a photovoltaic cell.

Figure 13C:
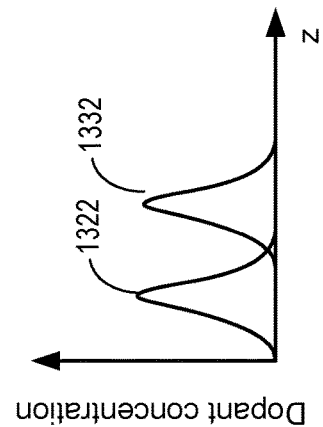

FIG. 13C shows examples of dopant concentration in the thickness direction of substrate 1310. In the illustrated example, a curve 1322 shows the dopant concentration of p-type dopants (or n-type dopants) in substrate 1310, and a curve 1332 shows the dopant concentration of n-type dopants (or p-type dopants) in substrate 1310. Curves 1322 and 1332 are for illustration purposes only. In various embodiments, the dopant concentration profile along the z direction may have different shapes, which may be customized by, for example, performing multiple implants with varying dose and energy. In one example, the p-type dopants may be implanted into substrate 1310 at a depth from about 0 μm to about 150 μm, and the n-type dopants may be implanted into substrate 1310 at a depth from about 1 μm to about 3 μm.

Even though not shown in FIGS. 13A-13C, waveguide 1300 may also include electrodes formed thereon. For example, a first electrode may be formed in an x-y plane on first layer 1320, and a second electrode may be formed in a y-z plane on sidewalls of substrate 1310. Other arrangements of the electrodes may also be used. The electrodes may include a metal material and/or a transparent conductive oxide as described above. In some embodiments, waveguide 1300 may also include gate dielectric materials, such as $SiO_2$, $Al_2O_3$, or hafnium oxide, formed thereon.

Figure 14B:
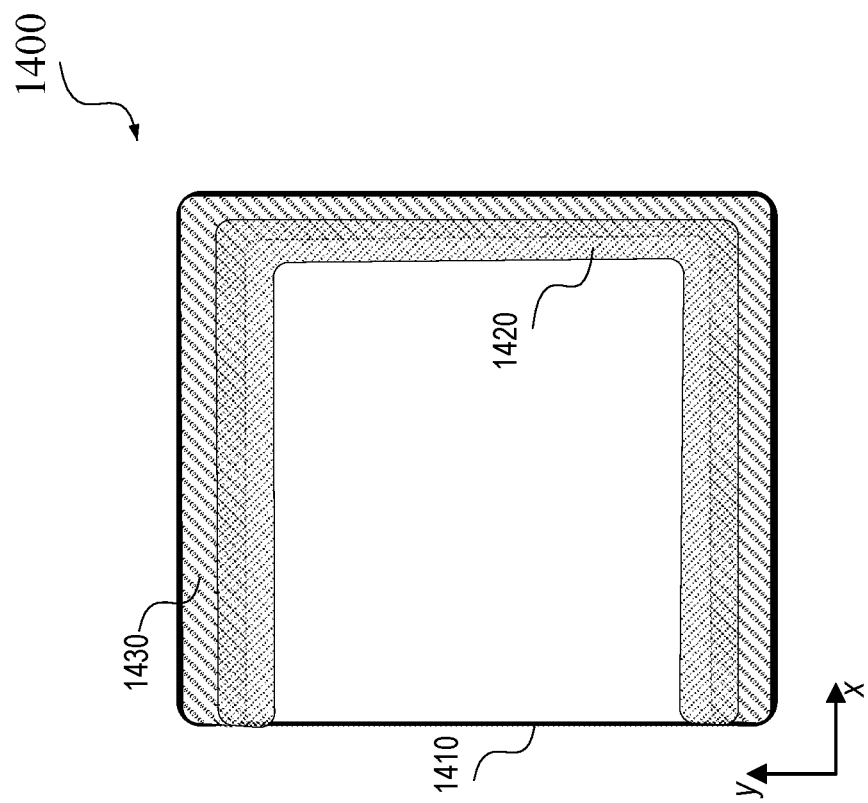
FIGS. 14A-14B illustrate an example of a waveguide including a photovoltaic device at the edges of the waveguide according to certain embodiments.
Figure 14A:
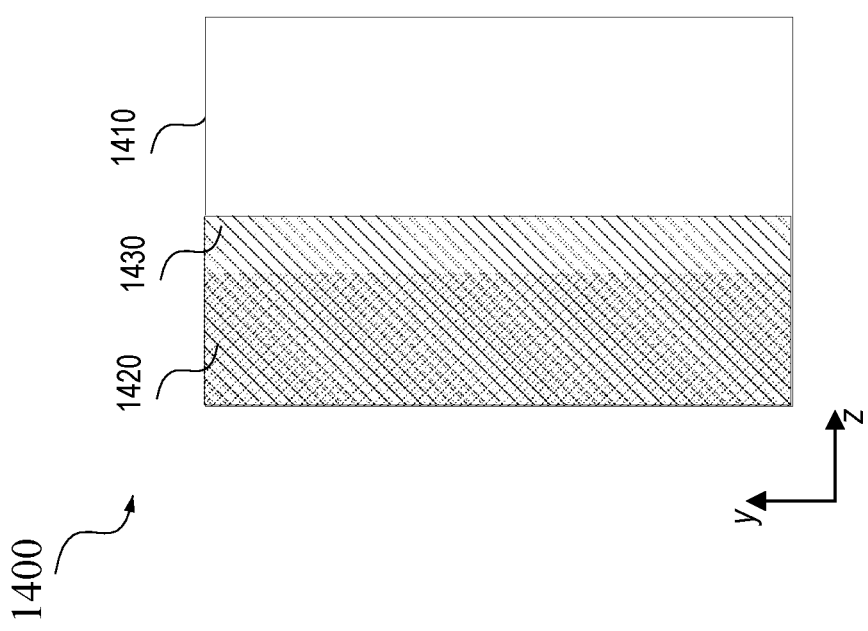

FIGS. 14A-14B illustrate an example of a waveguide 1400 including a photovoltaic device at the edges of waveguide 1400 according to certain embodiments. FIG. 14A shows a side view of the example of waveguide 1400 according to certain embodiments. FIG. 14B shows a front view of the example of waveguide 1400 according to certain embodiments. Waveguide includes a substrate 1410, the peripherals of which may be doped by implanting a p-type doping material (e.g., B, Al, Be, V, or Ga) and an n-type doping material (e.g., N, P, Ti, Cr, V, or As) through, for example, ion beam implantation, where the ion beam may bombard substrate 1410, for example, in the z-direction. The p-type dopants and the n-type dopants may be implanted into substrate 1410 at different regions in an x-y plane using different masks. For example, at shown in FIG. 14B, a first region 1420 may be mostly p-doped (or n-doped) and a second region 1430 may be mostly n-doped (or p-doped). First region 1420 and second region may form a p-n junction of a photovoltaic cell. The depth of first region 1420 and the depth of second region 1430 may be determined by the energy of the dopant ions during ion implantation. Even though not shown in FIGS. 14A-14B, waveguide 1400 may also include electrodes and gate dielectric materials formed thereon. For example, a first electrode may be formed in an x-y plane on first region 1420, and a second electrode may be formed in an x-y plane on second region 1430 or in a y-z plane on sidewalls of substrate 1410. Other arrangements of the electrodes may also be used. The electrodes may include a metal material and/or a transparent conductive oxide as described above.

Figure 15B:
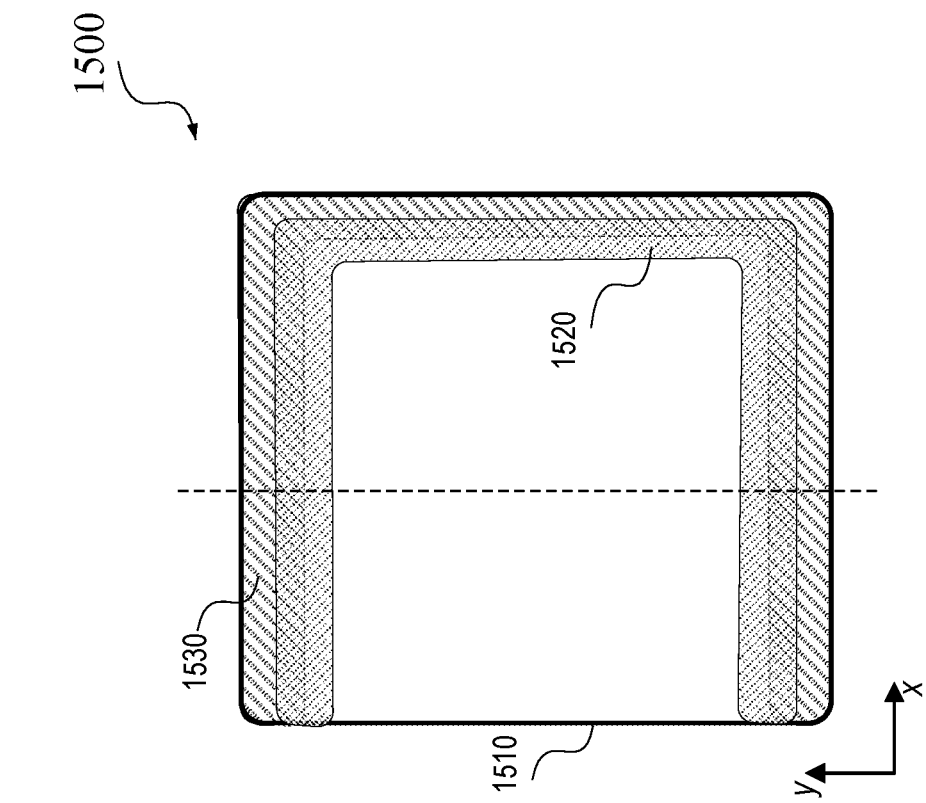
FIGS. 15A-15B illustrate an example of a waveguide including a photovoltaic device at the edges of the waveguide according to certain embodiments.
Figure 15A:
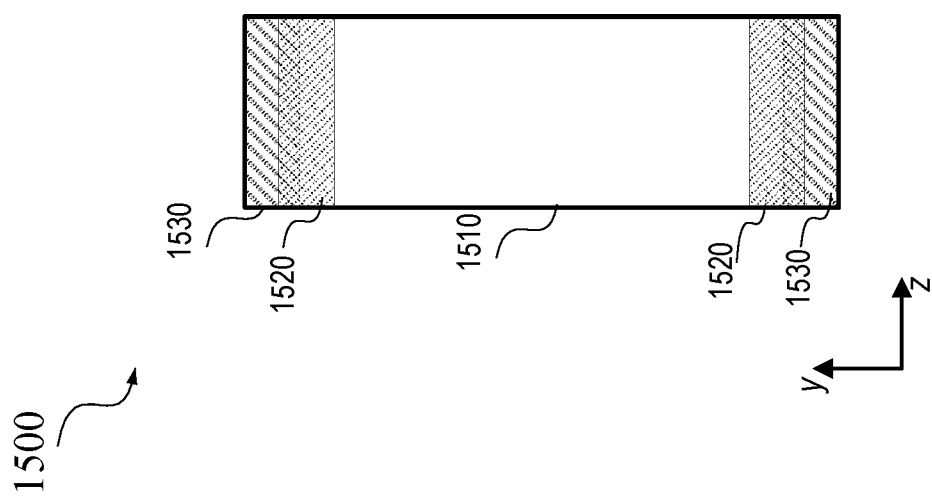

FIGS. 15A-15B illustrate an example of a waveguide 1500 including a photovoltaic device at the edges of waveguide 1500 according to certain embodiments. FIG. 15A shows a cross-sectional view of the example of waveguide 1500 according to certain embodiments. FIG. 15B shows a front view of the example of waveguide 1500 according to certain embodiments. Waveguide 1500 includes a substrate 1510, the peripherals of which may be doped by implanting a p-type doping material (e.g., B, Al, Be, V, or Ga) and an n-type doping material (e.g., N, P, Ti, Cr, V, or As) through, for example, ion beam implantation, where the ion beam may bombard sidewalls of substrate 1510, for example, in the x-direction and/or y-direction. The p-type dopants and the n-type dopants may be implanted into substrate 1510 at different speeds and/or energy levels, and thus may penetrate into different depths in substrate 1510 from the sidewalls of substrate 1510. For example, at shown in FIG. 15A, due to the different energy levels of the p-type implantation and the n-type implantation, a first layer 1520 may be mostly p-doped (or n-doped) and a second layer 1530 may be mostly n-doped (or p-doped). First layer and second layer 1530 may form a p-n junction of a photovoltaic cell. Even though not shown in FIGS. 15A-15B, waveguide 1500 may also include electrodes and gate dielectric materials formed thereon. For example, a first electrode may be formed in an x-y plane on first layer 1520, and a second electrode may be formed in a y-z plane on sidewalls of substrate 1510 or in an x-y plane on second layer 1530. Other arrangements of the electrodes may also be used. The electrodes may include a metal material and/or a transparent conductive oxide as described above.

In some embodiments, the waveguide substrate itself may be p-doped or n-doped, and the substrate may then be doped (e.g., implanted or diffused) with a material to form an oppositely doped layer near a surface of the peripheral regions of the substrate.

Figure 16B:
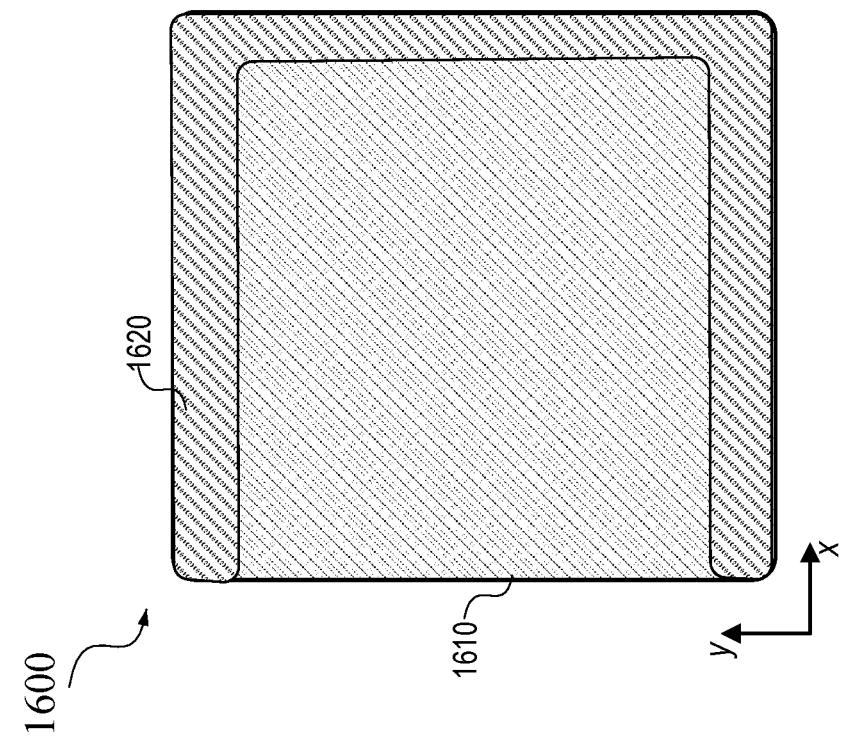
FIGS. 16A-16B illustrate an example of a waveguide including a photovoltaic device at the edges of the waveguide according to certain embodiments.
Figure 16A:
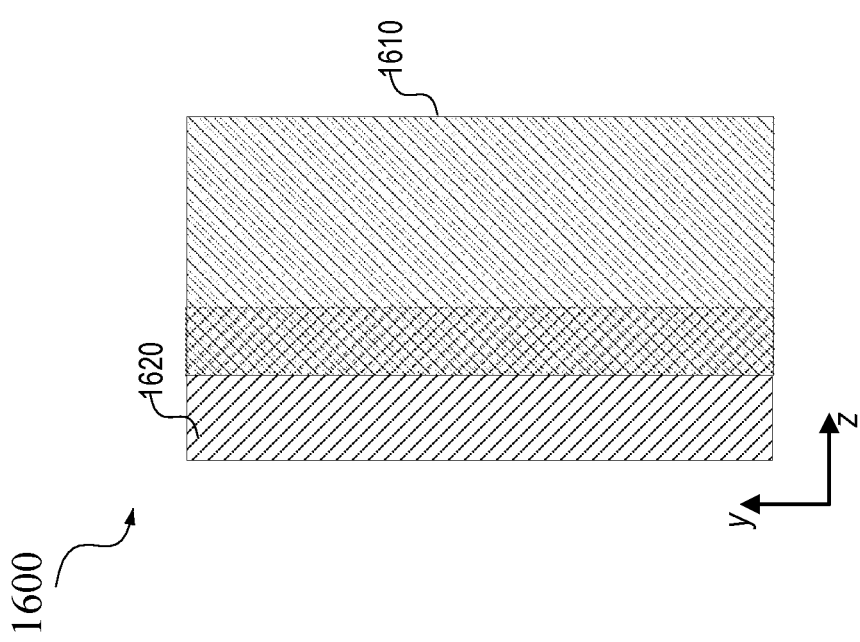

FIGS. 16A-16B illustrate an example of a waveguide 1600 including a photovoltaic device at the edges of waveguide 1600 according to certain embodiments. FIG. 16A shows a side view of the example of waveguide 1600 according to certain embodiments. FIG. 16B shows a front view of the example of waveguide 1600 according to certain embodiments. Waveguide includes a substrate 1610 that may be p-doped or n-doped. Peripheral regions of substrate may be doped by implanting a p-type dopant (e.g., B, Al, Be, V, or Ga) or an n-type dopant (e.g., N, P, Ti, Cr, V, or As) through, for example, ion beam implantation, where the ion beam may bombard substrate 1610, for example, in the z-direction using a mask. In one example, substrate 1610 may be p-doped and peripheral regions 1620 of substrate 1610 may be n-doped to form a p-n junction of a photovoltaic cell at peripheral regions 1620 of substrate 1610. The depth of the n-doped layer at peripheral regions 1620 may depend on the energy level of the dopant ions during ion implantation. Even though not shown in FIGS. 16A-16B, waveguide 1600 may also include electrodes and gate dielectric materials formed thereon. For example, a first electrode may be formed in an x-y plane on peripheral regions 1620, and a second electrode may be formed in an x-y plane on another region of substrate 1610 or on sidewalls of substrate 1610. Other arrangements of the electrodes may also be used. The electrodes may include a metal material and/or a transparent conductive oxide as described above.

In some embodiments, the waveguide substrate may be made of n-type or p-type doped material, and one or more layers of an oppositely doped material may be deposited on the substrate at the edges of the waveguide substrate. For example, the layer of the oppositely doped material may be deposited on peripheral regions 1620 of substrate 1610. In some embodiments, the layer of the oppositely doped material may have a high refractive index that is close to or match the refractive index of the substrate (e.g., >2.0, >2.5, or higher).

In some embodiments, one or more layers of a p-type material (organic or inorganic, e.g., semiconductor) and one or more layers of an n-type material (organic or inorganic, e.g., semiconductor) may be deposited on the surface (e.g., sidewalls or broadside surface) of the waveguide substrate at the edges of waveguide substrate to form a photovoltaic cell. In some embodiments, the layer of the n-type material and the layer of the p-type material may have a high refractive index that is close to the refractive index of the substrate (e.g., >2.0, >2.5, or higher). Transparent and/or non-transparent electrodes may be used to collect carriers and conduct photocurrent generated in the p-n junctions by the absorbed photons.

Figure 17B:
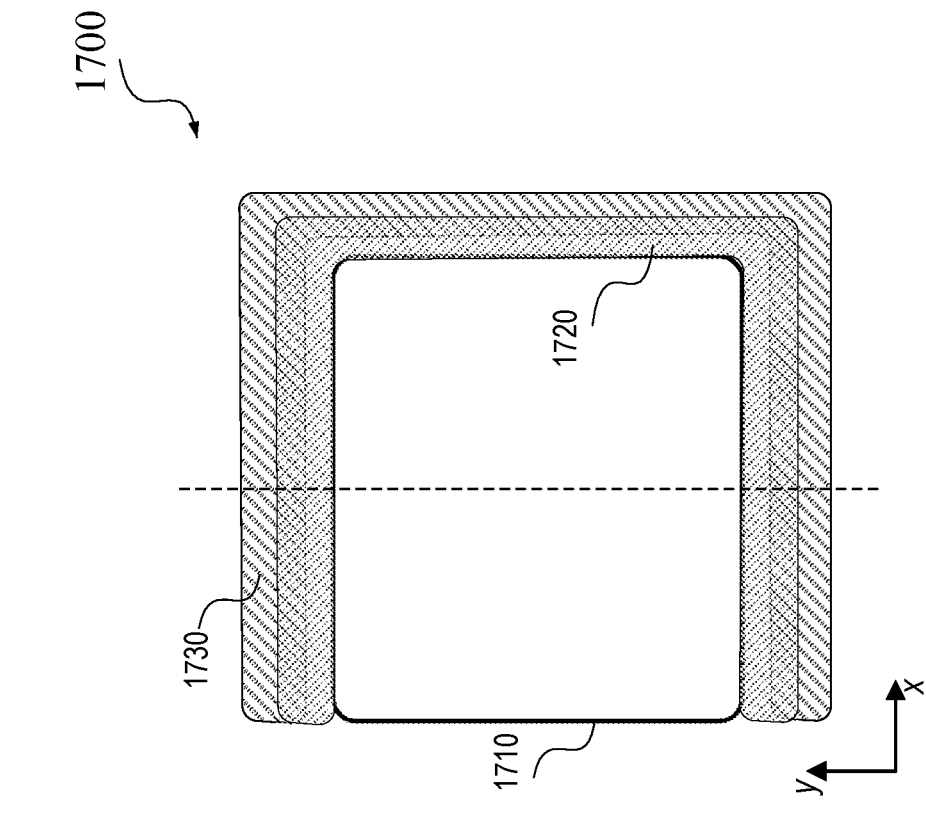
FIGS. 17A-17B illustrate an example of a waveguide including a photovoltaic device at the edges of the waveguide according to certain embodiments.
Figure 17A:
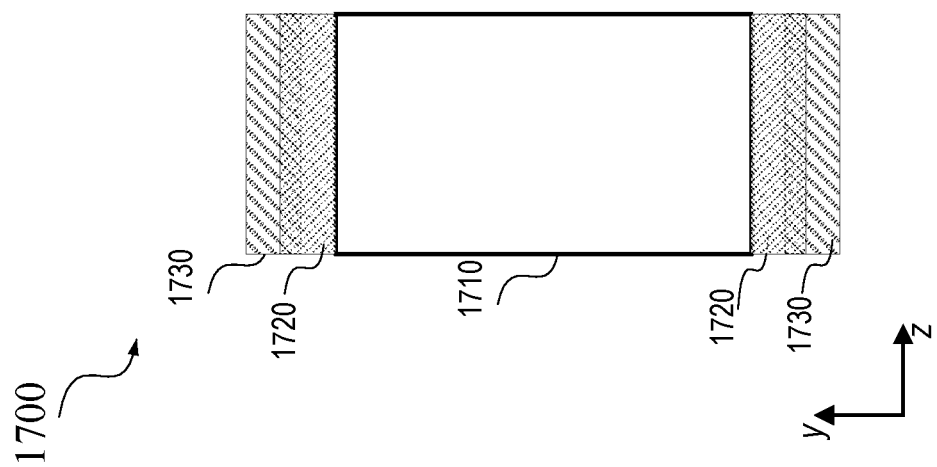

FIGS. 17A-17B illustrate an example of a waveguide 1700 including a photovoltaic device at the edges of waveguide 1700 according to certain embodiments. FIG. 17A shows a cross-sectional view of the example of waveguide 1700 according to certain embodiments. FIG. 17B shows a front view of the example of waveguide 1700 according to certain embodiments. Waveguide 1700 includes a substrate 1710. Substrate 1710 may include multiple thin layers deposited on sidewalls of substrate 1710. The multiple thin layers may include, for example, a first layer 1720 and a second layer 1730, where first layer 1720 and second layer 1730 may be oppositely doped. In one example, first layer 1720 may be n-doped and second layer 1730 may be p-doped. In another example, first layer 1720 may be p-doped and second layer 1730 may be n-doped. Even though not shown in FIGS. 17A-17B, waveguide 1700 may also include electrodes and gate dielectric materials formed thereon. For example, a first electrode may include a TCO layer between first layer 1720 and sidewalls of substrate 1710, and a second electrode may be formed on sidewalls of second layer 1730. Other arrangements of the electrodes may also be used. The electrodes may include a metal material and/or a transparent conductive oxide as described above.

In some embodiments, multiple pairs of an n-doped semiconductor layer and a p-doped semiconductor layer may be deposited on sidewalls or peripheral regions of the broadside surface of the waveguide substrate to form a tandem photovoltaic cell, a multi-junction photovoltaic cell, or a stacked cell, which may have a wider absorption spectrum, a higher absorption, and a higher open circuit voltage. For example, one photovoltaic cell in a stacked cell may have a peak absorption for red light, one photovoltaic cell in the stacked cell may have a peak absorption for green light, and one photovoltaic cell in the stacked cell may have a peak absorption for blue light. In some embodiments, the n-doped semiconductor layer and the p-doped semiconductor layer may have a high refractive index that is close to the refractive index of the substrate (e.g., >2.0, >2.5, or higher).

Figure 18B:
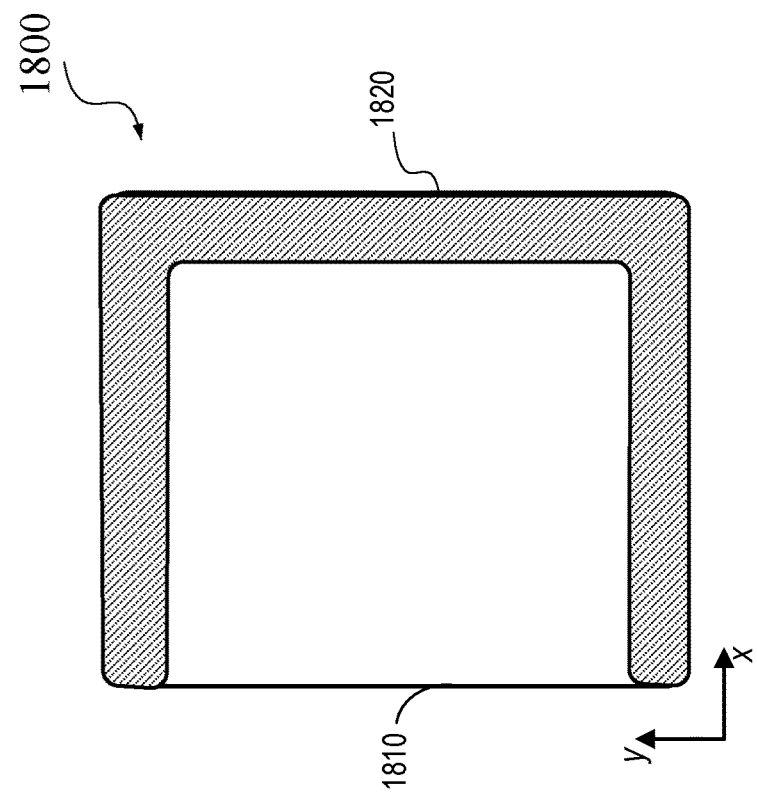
FIGS. 18A-18B illustrate an example of a waveguide including a photovoltaic device at the edges of the waveguide according to certain embodiments.
Figure 18A:
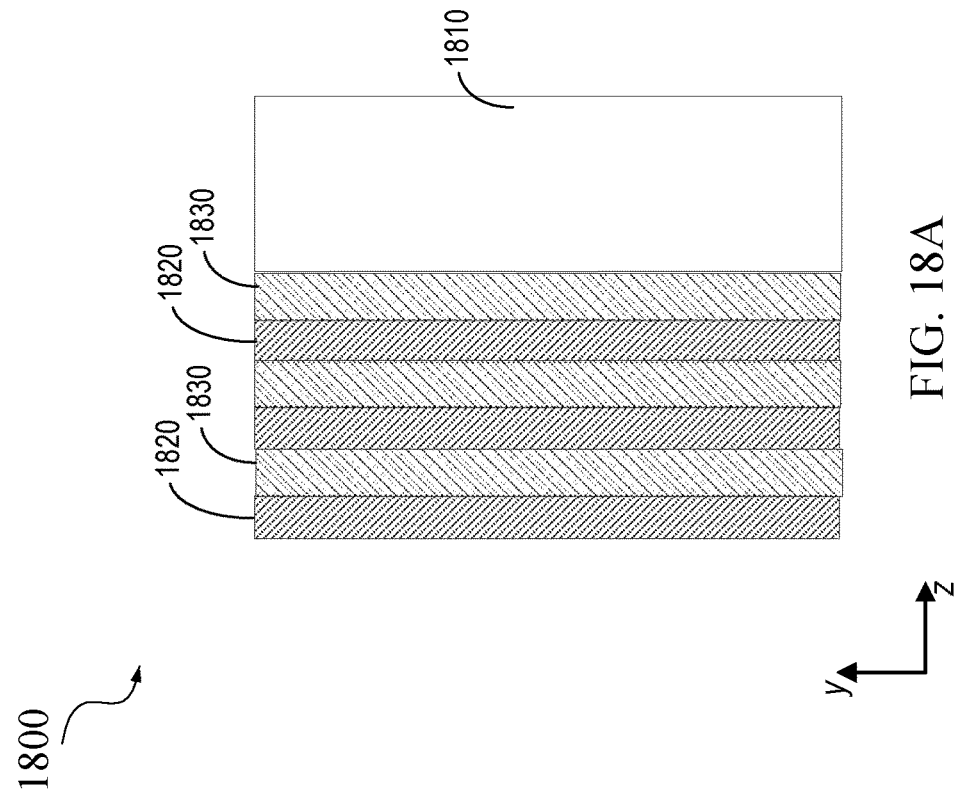

FIGS. 18A-18B illustrate an example of a waveguide 1800 including a photovoltaic device at the edges of waveguide 1800 according to certain embodiments. FIG. 18A shows a side view of the example of waveguide 1800 according to certain embodiments. FIG. 18B shows a front view of the example of waveguide 1800 according to certain embodiments. Waveguide includes a substrate 1810. One or more pairs of a p-type material layer 1820 and an n-type material layer 1830 may be deposited on a broadside surface of substrate 1810 at peripheral regions of substrate 1810 to form a stacked cell that includes one or more photovoltaic cells formed by one or more p-n junctions. In some embodiments, the photovoltaic cells in the stacked cell may have different peak absorption wavelengths. The stacked cell may have a higher open-circuit voltage. Even though not shown in FIGS. 18A-18B, waveguide 1800 may also include electrodes and gate dielectric materials formed thereon. For example, a TCO electrode may be deposited on substrate 1810 before depositing p-type material layers 1820 and n-type material layers 1830. A metal electrode layer may be deposited on the p-type material layers 1820 at the top of the stack. Other arrangements of the electrodes may also be used.

In some embodiments, multiple thin film layers may be deposited on peripheral regions of the broadside surface and/or sidewalls of the substrate of the waveguide to form one or more thin-film photovoltaic devices in a stack. The multiple thin films layers may include, for example, organic or inorganic photovoltaic materials, such as amorphous silicon carbide (with or without dopants), crystalline silicon, cadmium telluride (CdTe), copper indium gallium diselenide (CIGS), copper indium selenide (CIS), perovskite materials, carbon-rich (organic) compounds, quantum dots materials, dye-sensitized organic materials, and the like.

Even though not shown in figures described above, photovoltaic devices at the edges of waveguide substrates described above may include other layers, such as antireflection layers, hole transport layers, electron transport layers, buffer layers, and the like. The electrodes at the edges of the waveguide display may be in electrical contact with circuits embedded in or attached to the frame of the waveguide display, such as a rechargeable battery and/or electrical circuits described with respect to FIGS. 7 and 20.

Figure 19:
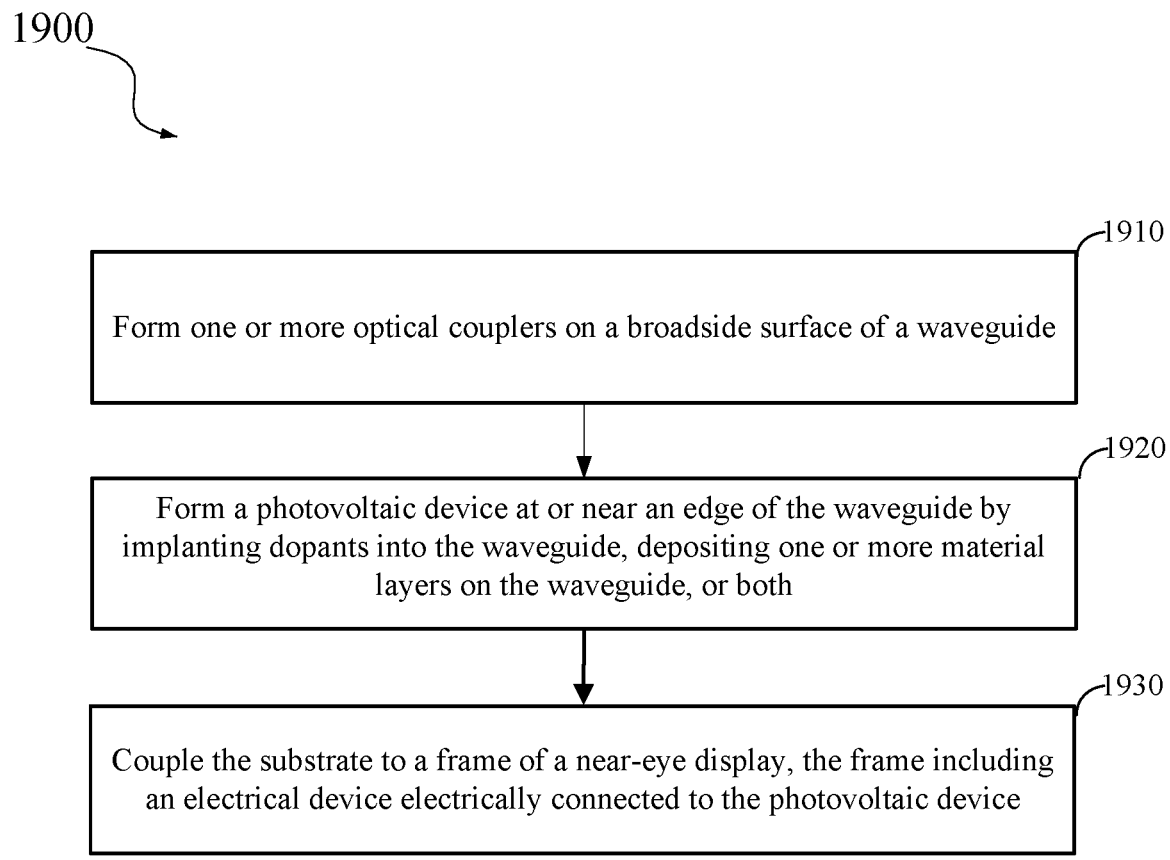
FIG. 19 includes a flowchart illustrating an example of a process of making a near-eye display according to certain embodiments.

FIG. 19 includes a flowchart 1900 illustrating an example of a process of making a near-eye display according to certain embodiments. The operations described in flowchart 1900 are for illustration purposes only and are not intended to be limiting. In various implementations, modifications may be made to flowchart 1900 to add additional operations, to omit some operations, or to change the order of the operations. It should be appreciated that the specific steps illustrated in FIG. 19 provide a particular method of making a near-eye display. Other sequences of steps may also be performed according to alternative embodiments. For example, alternative embodiments of the present invention may perform the steps outlined above in a different order. Moreover, the individual steps illustrated in FIG. 19 may include multiple sub-steps that may be performed in various sequences as appropriate to the individual step. Additional steps may be added or removed depending on the particular applications. One of ordinary skill in the art would recognize many variations, modifications, and alternatives. Furthermore, the operations in flowchart 1900 may be performed by one entity or may be performed by multiple entities based on the request or instructions of one entity.

Operations at block 1910 may include forming one or more couplers on a broadside surface of a waveguide. The waveguide may include a substrate that is transparent to visible light and have a high refractive index, such as greater than about 2.0 or greater than about 2.5. In one example, the waveguide may include a SiC substrate. The couplers may include, for example, a prism, a surface-relief grating, or a holographic grating. The surface-relief grating may be etched in the waveguide or in a material layer deposited on the waveguide. Due to the high refractive index of the waveguide, the surface-relief grating may have a high refractive index contrast, and thus may have a high diffraction efficiency (even for a grating with a low grating depth), a large field of view, and/or a wide wavelength range, and may be easy to fabricate (e.g., because of the low grating depth). The holographic grating may be recorded on a holographic material layer coated or laminated on the waveguide. As described above, the waveguide may include two or more grating couplers.

Operations at block 1920 may include forming a photovoltaic device at an edge of the waveguide by, for example, implanting dopants into the waveguide, depositing one or more material layers on the waveguide, or both. In some embodiments, forming the photovoltaic device at the edge of the waveguide may include implanting p-type dopants into the waveguide at a first implant depth range from a surface (e.g., a broadside surface or a sidewall surface) of the waveguide, and implanting n-type dopants into the waveguide at a second implant depth range from the surface of the waveguide, where the second implant depth range is different from the first implant depth range. In some embodiments, forming the photovoltaic device at the edge of the waveguide may include implanting p-type dopants into the waveguide at a first region of the broadside surface of the waveguide using a first mask, and implanting n-type dopants into the waveguide at a second region of the broadside surface of the waveguide using a second mask, where the first region of the broadside surface may or may not overlap with the second region of the broadside surface, such that a p-n structure or p-i-n structure may be formed. In some embodiments, the waveguide may be p-doped, where forming the photovoltaic device at the edge of the waveguide may include implanting n-type dopants into a surface layer of the waveguide or depositing an n-type material layer on the waveguide. In some embodiments, the waveguide may be n-doped, where forming the photovoltaic device at the edge of the waveguide may include implanting p-type dopants into a surface layer of the waveguide or depositing a p-type material layer on the waveguide. In some embodiments, forming the photovoltaic device at the edge of the waveguide may include depositing an n-type material layer on the broadside surface or sidewalls of the waveguide, and depositing a p-type material layer on the broadside surface or the sidewalls of the waveguide. In some embodiments, forming the photovoltaic device at the edge of the waveguide may include depositing a plurality of thin-film layers on the broadside surface or sidewalls of the waveguide at the edge of the waveguide. The plurality of thin-film layers may include, for example, an amorphous silicon carbide layer, a crystalline silicon layer, a cadmium telluride (CdTe) layer, a copper indium gallium selenide (CIGS) layer, a copper indium selenide (CIS) layer, a perovskite material layer, a dye-sensitized organic material layer, a quantum dots material layer, or a combination thereof. Forming the photovoltaic device at the edge of the waveguide further may also include depositing two electrode layers that include a metal layer, a transparent conductive oxide, or both. In some embodiments, the photovoltaic device may also include a transparent and non-conductive gate dielectric material layer. In some embodiments, the photovoltaic device may also include an antireflection layer, a hole transport layer, an electron transport layer, a buffer layer, or a combination thereof. In some embodiments, the photovoltaic device may be a tandem photovoltaic cell or a stacked cell that includes one or more p-n junctions in a stack formed by one or more pairs of a p-type semiconductor layer and an n-type semiconductor layer.

Operations at block 1930 may include coupling the substrate to a frame of a near-eye display that includes an electrical device, such that the electrical device is electrically connected to the photovoltaic device when the substrate is properly positioned in the frame and held by the frame. The electrical device may include, for example, a rechargeable battery or a circuit described with respect to FIGS. 1, 7, and 20. Photocurrent generated by the photovoltaic cell using the display light may be used to charge the rechargeable battery or drive the circuit. As such, the overall efficiency of the near-eye display may be improved.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 20:
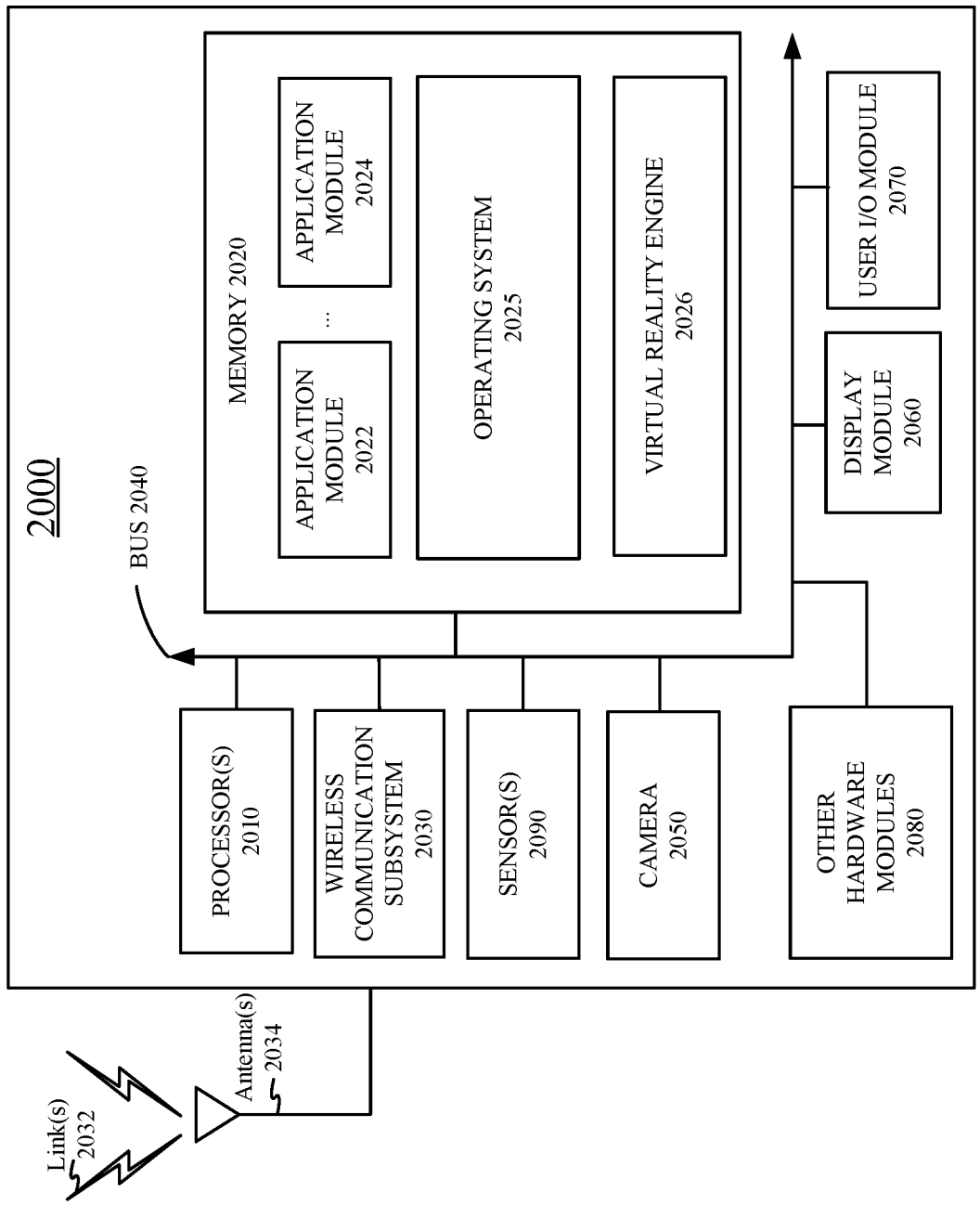
FIG. 20 is a simplified block diagram of an electronic system of an example of a near-eye display according to certain embodiments.

FIG. 20 is a simplified block diagram of an electronic system 2000 of an example near-eye display (e.g., HMD device) for implementing some of the examples disclosed herein. Electronic system 2000 may be used as the electronic system of an HMD device or other near-eye displays described above. In this example, electronic system 2000 may include one or more processor(s) 2010 and a memory 2020. Processor(s) 2010 may be configured to execute instructions for performing operations at a number of components, and can be, for example, a general-purpose processor or microprocessor suitable for implementation within a portable electronic device. Processor(s) 2010 may be communicatively coupled with a plurality of components within electronic system 2000. To realize this communicative coupling, processor(s) may communicate with the other illustrated components across a bus 2040. Bus 2040 may be any subsystem adapted to transfer data within electronic system 2000. Bus 2040 may include a plurality of computer buses and additional circuitry to transfer data.

Memory 2020 may be coupled to processor(s) 2010. In some embodiments, memory may offer both short-term and long-term storage and may be divided into several units. Memory 2020 may be volatile, such as static random access memory (SRAM) and/or dynamic random access memory (DRAM) and/or non-volatile, such as read-only memory (ROM), flash memory, and the like. Furthermore, memory 2020 may include removable storage devices, such as secure digital (SD) cards. Memory 2020 may provide storage of computer-readable instructions, data structures, program modules, and other data for electronic system 2000. In some embodiments, memory 2020 may be distributed into different hardware modules. A set of instructions and/or code might be stored on memory 2020. The instructions might take the form of executable code that may be executable by electronic system 2000, and/or might take the form of source and/or installable code, which, upon compilation and/or installation on electronic system 2000 (e.g., using any of a variety of generally available compilers, installation programs, compression/decompression utilities, etc.), may take the form of executable code.

In some embodiments, memory 2020 may store a plurality of application modules 2022 through 2024, which may include any number of applications. Examples of applications may include gaming applications, conferencing applications, video playback applications, or other suitable applications. The applications may include a depth sensing function or eye tracking function. Application modules 2022-2024 may include particular instructions to be executed by processor(s) 2010. In some embodiments, certain applications or parts of application modules 2022-2024 may be executable by other hardware modules 2080. In certain embodiments, memory 2020 may additionally include secure memory, which may include additional security controls to prevent copying or other unauthorized access to secure information.

In some embodiments, memory 2020 may include an operating system 2025 loaded therein. Operating system 2025 may be operable to initiate the execution of the instructions provided by application modules 2022-2024 and/or manage other hardware modules 2080 as well as interfaces with a wireless communication subsystem 2030 which may include one or more wireless transceivers. Operating system 2025 may be adapted to perform other operations across the components of electronic system 2000 including threading, resource management, data storage control and other similar functionality.

Wireless communication subsystem 2030 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 2000 may include one or more antennas 2034 for wireless communication as part of wireless communication subsystem 2030 or as a separate component coupled to any portion of the system. Depending on desired functionality, wireless communication subsystem 2030 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 2030 may permit data to be exchanged with a network, other computer systems, and/or any other devices described herein. Wireless communication subsystem 2030 may include a means for transmitting or receiving data, such as identifiers of HMD devices, position data, a geographic map, a heat map, photos, or videos, using antenna(s) and wireless link(s) 2032. Wireless communication subsystem 2030, processor(s) 2010, and memory 2020 may together comprise at least a part of one or more of a means for performing some functions disclosed herein.

Embodiments of electronic system 2000 may also include one or more sensors 2090. Sensor(s) 2090 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 2090 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 2000 may include a display module 2060. Display module 2060 may be a near-eye display, and may graphically present information, such as images, videos, and various instructions, from electronic system 2000 to a user. Such information may be derived from one or more application modules 2022-2024, virtual reality engine 2026, one or more other hardware modules 2080, a combination thereof, or any other suitable means for resolving graphical content for the user (e.g., by operating system 2025). Display module 2060 may use LCD technology, LED technology (including, for example, OLED, ILED, µ-LED, AMOLED, TOLED, etc.), light emitting polymer display (LPD) technology, or some other display technology.

Electronic system 2000 may include a user input/output module 2070. User input/output module 2070 may allow a user to send action requests to electronic system 2000. An action request may be a request to perform a particular action. For example, an action request may be to start or end an application or to perform a particular action within the application. User input/output module 2070 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 2000. In some embodiments, user input/output module 2070 may provide haptic feedback to the user in accordance with instructions received from electronic system 2000. For example, the haptic feedback may be provided when an action request is received or has been performed.

Electronic system 2000 may include a camera 2050 that may be used to take photos or videos of a user, for example, for tracking the user's eye position. Camera 2050 may also be used to take photos or videos of the environment, for example, for VR, AR, or MR applications. Camera 2050 may include, for example, a complementary metal-oxide-semiconductor (CMOS) image sensor with a few millions or tens of millions of pixels. In some implementations, camera may include two or more cameras that may be used to capture 3-D images.

In some embodiments, electronic system 2000 may include a plurality of other hardware modules 2080. Each of other hardware modules 2080 may be a physical module within electronic system 2000. While each of other hardware modules 2080 may be permanently configured as a structure, some of other hardware modules 2080 may be temporarily configured to perform specific functions or temporarily activated. Examples of other hardware modules may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 2080 may be implemented in software.

In some embodiments, memory 2020 of electronic system 2000 may also store a virtual reality engine 2026. Virtual reality engine 2026 may execute applications within electronic system 2000 and receive position information, acceleration information, velocity information, predicted future positions, or any combination thereof of the HMD device from the various sensors. In some embodiments, the information received by virtual reality engine 2026 may be used for producing a signal (e.g., display instructions) to display module 2060. For example, if the received information indicates that the user has looked to the left, virtual reality engine 2026 may generate content for the HMD device that mirrors the user's movement in a virtual environment. Additionally, virtual reality engine 2026 may perform an action within an application in response to an action request received from user input/output module 2070 and provide feedback to the user. The provided feedback may be visual, audible, or haptic feedback. In some implementations, processor(s) 2010 may include one or more GPUs that may execute virtual reality engine 2026.

In various implementations, the above-described hardware and modules may be implemented on a single device or on multiple devices that can communicate with one another using wired or wireless connections. For example, in some implementations, some components or modules, such as GPUs, virtual reality engine 2026, and applications (e.g., tracking application), may be implemented on a console separate from the head-mounted display device. In some implementations, one console may be connected to or support more than one HMD.

In alternative configurations, different and/or additional components may be included in electronic system 2000. Similarly, functionality of one or more of the components can be distributed among the components in a manner different from the manner described above. For example, in some embodiments, electronic system 2000 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean A, B, C, or any combination of A, B, and C, such as AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A waveguide display comprising:
   a waveguide configured to transport display light visible to human eyes;
   a coupler formed on a broadside surface of the waveguide and configured to couple portions of the display light out of the waveguide at one or more regions of the waveguide; and
   a photovoltaic device at an edge of the waveguide, the photovoltaic device configured to convert at least a portion of the display light that reaches the edge of the waveguide into electrical power.

2. The waveguide display of claim 1, wherein the photovoltaic device includes a p-type layer and an n-type layer, and wherein at least one of the p-type layer, the n-type layer, or both are formed in the waveguide.

3. The waveguide display of claim 2, wherein the p-type layer and the n-type layer are implanted in the waveguide and are at different depths from the broadside surface of the waveguide.

4. The waveguide display of claim 2, wherein the p-type layer and the n-type layer are implanted in the waveguide and are at different depths from a sidewall surface of the waveguide.

5. The waveguide display of claim 2, wherein the waveguide is p-doped and a surface layer of the waveguide is n-doped.

6. The waveguide display of claim 2, wherein the waveguide is n-doped and a surface layer of the waveguide is p-doped.

7. The waveguide display of claim 2, wherein dopants in the n-type layer include N, P, As, Ti, Cr, V, or a combination thereof, and wherein dopants in the p-type layer include B, Al, Ga, Ge, V, or a combination thereof.

8. The waveguide display of claim 1, wherein the photovoltaic device includes a p-type region and an n-type region, and wherein the p-type region and the n-type region are formed in the waveguide and are at different regions of the broadside surface of the waveguide.

9. The waveguide display of claim 1, wherein the photovoltaic device includes a p-type layer and an n-type layer, and wherein at least one of the p-type layer, the n-type layer, or both are deposited on the broadside surface or sidewalls of the waveguide.

10. The waveguide display of claim 1, wherein the photovoltaic device includes a thin-film photovoltaic cell, the thin-film photovoltaic cell including a plurality of thin-film layers deposited on the broadside surface or sidewalls of the waveguide.

11. The waveguide display of claim 10, wherein the plurality of thin-film layers includes an amorphous silicon carbide layer, a crystalline silicon layer, a cadmium telluride (CdTe) layer, a copper indium gallium selenide (CIGS) layer, a copper indium selenide (CIS) layer, a perovskite material layer, a dye-sensitized organic material layer, a quantum dots material layer, or a combination thereof.

12. The waveguide display of claim 1, wherein the waveguide is characterized by a refractive index greater than 2.0.

13. The waveguide display of claim 1, wherein the waveguide includes a substrate of SiC, $LiNbO_3$, rutile, zinc sulfide, or zinc selenide.

14. The waveguide display of claim 1, further comprising two electrodes, the two electrodes including a metal electrode, a transparent conductive oxide electrode, or both.

15. The waveguide display of claim 1, wherein the photovoltaic device includes a tandem photovoltaic cell, a multijunction photovoltaic cell, or a stacked photovoltaic cell including photovoltaic cells having peak absorption at different wavelengths.

16. The waveguide display of claim 1, further comprising a gate dielectric layer.

17. The waveguide display of claim 1, further comprising a rechargeable battery or an electrical circuit connected to the photovoltaic device.

18. A near-eye display system comprising:
- a frame;
- one or more projectors configured to generate display light for displaying an image to a user's eye;
- a waveguide coupled to the frame and configured to transport the display light;
- one or more couplers configured to coupler the display light from the one or more projectors into the waveguide;
- an output coupler formed on a broadside surface of the waveguide and configured to couple portions of the display light out of the waveguide at one or more regions of the waveguide; and
- a photovoltaic device at an edge of the waveguide and electrically coupled to the frame, the photovoltaic device configured to convert at least a portion of the display light that reaches the edge of the waveguide into electrical power.

19. A method comprising:
- forming one or more optical couplers on a broadside surface of a waveguide;
- forming a photovoltaic device at an edge of the waveguide; and
- coupling the waveguide to a frame of a near-eye display, the coupling including electrically coupling the photovoltaic device to an electrical device on the frame.

20. The method of claim 19, wherein forming the photovoltaic device at the edge of the waveguide comprises:
- implanting p-type dopants into the waveguide at a first implant depth range from the broadside surface or a sidewall surface of the waveguide; and
- implanting n-type dopants into the waveguide at a second implant depth range from the broadside surface or the sidewall surface of the waveguide, the second implant depth range different from the first implant depth range.

* * * * *